United States Patent [19]
Lan et al.

[11] Patent Number: 5,906,042
[45] Date of Patent: May 25, 1999

[54] METHOD AND STRUCTURE TO INTERCONNECT TRACES OF TWO CONDUCTIVE LAYERS IN A PRINTED CIRCUIT BOARD

[75] Inventors: James J. D. Lan, Fremont; Steve S. Chiang, Saratoga, both of Calif.; William H. Shepherd, Placitas, N.M.; Paul Y. F. Wu; John Y. Xie, both of San Jose, Calif.

[73] Assignee: Prolinx Labs Corporation, San Jose, Calif.

[21] Appl. No.: 08/538,886

[22] Filed: Oct. 4, 1995

[51] Int. Cl.⁶ .................................................. H01K 3/10
[52] U.S. Cl. ................................ 29/852; 29/830; 156/89; 427/97
[58] Field of Search ............................. 29/852, 829, 830; 156/89; 427/97

[56] References Cited

U.S. PATENT DOCUMENTS

| | | |
|---|---|---|
| 3,335,327 | 8/1967 | Damon et al. . |
| 3,384,879 | 5/1968 | Stahl et al. . |
| 3,615,913 | 10/1971 | Shaw ...................................... 148/33.3 |
| 3,770,529 | 11/1973 | Anderson ............................... 29/852 X |
| 3,808,576 | 4/1974 | Castonguay et al. ..................... 338/309 |
| 3,857,683 | 12/1974 | Castonguay ................................. 29/195 |
| 3,923,359 | 12/1975 | Newsam . |
| 4,024,629 | 5/1977 | Lemoine et al. ........................... 29/852 |
| 4,090,667 | 5/1978 | Crimmins . |
| 4,146,863 | 3/1979 | Mollenhoff ................................. 337/296 |
| 4,238,839 | 12/1980 | Redfern et al. ............................ 365/96 |
| 4,245,273 | 1/1981 | Feinberg et al. ........................... 361/382 |
| 4,247,981 | 2/1981 | Walters ...................................... 29/845 |
| 4,386,051 | 5/1983 | Edgington ................................. 420/589 |
| 4,399,372 | 8/1983 | Tanimoto et al. ....................... 307/279 |
| 4,413,272 | 11/1983 | Mochizuki et al. . |
| 4,420,820 | 12/1983 | Preedy ..................................... 365/105 |
| 4,424,578 | 1/1984 | Miyamoto ................................ 365/104 |
| 4,433,331 | 2/1984 | Kollaritsch ........................... 340/825.83 |
| 4,434,134 | 2/1984 | Darrow et al. ......................... 29/852 X |
| 4,455,495 | 6/1984 | Masuhara et al. ......................... 307/44 |

(List continued on next page.)

FOREIGN PATENT DOCUMENTS

| | | |
|---|---|---|
| 0336359 | 10/1989 | European Pat. Off. . |
| 510900-A2 | 10/1992 | European Pat. Off. . |
| 59-13368 | 1/1984 | Japan . |

OTHER PUBLICATIONS

"A Large Format Modified TEA $CO_2$ Laser Based Process for Cost Effective Small Via Generation", J.M. Morrison, etc., MCM '94 Proceedings, pp. 369–377.

"The Application of Laser Process Technology to Thin Film Packaging", T.F. Redmond, etc., IEEE 1992, pp. 1066–1071.

"Rigid–Flex: The Old and The New", Jahn Stopperan, Sheldahl, Inc., 4 pages.

"A New Circuit Substrate For MCM–L", Yusuke Wada, ICEMCM, 1995, pp. 59–64.

"Matsushita Team Eliminates Holes in High–Density PCB", Kenji Tsuda, Tokyo, Nikkei Electronics Asia, Mar. 1995, pp. 69–70.

(List continued on next page.)

*Primary Examiner*—Carl J. Arbes
*Attorney, Agent, or Firm*—Skjerven, Morrill, Morrill, MacPherson, Franklin & Friel LLP; Alan H. MacPherson; Omkar K. Suryadevara

[57] ABSTRACT

A micro filled material includes a binding material and optionally includes a number of particles. The binding material and the particles can be formed of any conductive or nonconductive material. Using such a micro filled via material, an electrical conductor is formed in a substrate for supporting one or more electronic components using the following steps: placing the micro filled via material between two conductive layers at various locations in a substrate at which an electrical conductor is to be formed; and optionally programming the micro filled via material to reduce the resistance of, or to form an electrical conductor.

30 Claims, 16 Drawing Sheets

U.S. PATENT DOCUMENTS

| | | | |
|---|---|---|---|
| 4,458,297 | 7/1984 | Stopper et al. | 361/403 |
| 4,488,262 | 12/1984 | Basire et al. | 365/104 |
| 4,491,860 | 1/1985 | Lim . | |
| 4,507,756 | 3/1985 | McElroy | 365/104 |
| 4,507,757 | 3/1985 | McElroy | 365/104 |
| 4,547,830 | 10/1985 | Yamauchi | 361/104 |
| 4,562,639 | 1/1986 | McElroy | 29/584 |
| 4,565,712 | 1/1986 | Noguchi et al. | 427/53.1 |
| 4,566,186 | 1/1986 | Bauer et al. | 29/852 |
| 4,569,120 | 2/1986 | Stacy et al. . | |
| 4,569,121 | 2/1986 | Lim et al. . | |
| 4,585,490 | 4/1986 | Raffel et al. | 148/1.5 |
| 4,590,589 | 5/1986 | Gerzberg | 365/100 |
| 4,609,241 | 9/1986 | Peterson | 339/17 CF |
| 4,642,160 | 2/1987 | Burgess | 156/630 |
| 4,651,409 | 3/1987 | Ellsworth et al. . | |
| 4,652,974 | 3/1987 | Ryan | 361/395 |
| 4,678,889 | 7/1987 | Yamanaka | 219/121 |
| 4,689,411 | 8/1987 | Dick et al. | 174/68.5 |
| 4,700,116 | 10/1987 | Inoue et al. | 318/254 |
| 4,700,214 | 10/1987 | Johnson . | |
| 4,710,592 | 12/1987 | Kimbara . | |
| 4,721,868 | 1/1988 | Cornell et al. | 307/465 |
| 4,726,991 | 2/1988 | Hyatt et al. | 428/329 |
| 4,731,704 | 3/1988 | Lochner | 361/400 |
| 4,732,780 | 3/1988 | Mituff et al. | 29/852 X |
| 4,748,490 | 5/1988 | Hollingsworth . | |
| 4,757,359 | 7/1988 | Chiao et al. . | |
| 4,780,670 | 10/1988 | Cherry | 324/158 |
| 4,786,904 | 11/1988 | Graham, III et al. | 340/825.83 |
| 4,789,760 | 12/1988 | Koyama et al. . | |
| 4,791,075 | 12/1988 | Lin | 437/209 |
| 4,792,646 | 12/1988 | Enomoto . | |
| 4,792,835 | 12/1988 | Sacarisen et al. . | |
| 4,796,074 | 1/1989 | Roesner . | |
| 4,796,075 | 1/1989 | Whitten . | |
| 4,799,128 | 1/1989 | Chen | 361/414 |
| 4,799,984 | 1/1989 | Rellick | 29/852 X |
| 4,803,595 | 2/1989 | Kraus et al. | 361/412 |
| 4,808,967 | 2/1989 | Rice et al. | 338/309 |
| 4,821,142 | 4/1989 | Ushifusa et al. | 361/395 |
| 4,823,181 | 4/1989 | Mohsen et al. . | |
| 4,829,404 | 5/1989 | Jensen | 361/398 |
| 4,839,864 | 6/1989 | Fujishima | 365/200 |
| 4,840,924 | 6/1989 | Kinbara | 437/189 |
| 4,841,099 | 6/1989 | Epstein et al. . | |
| 4,845,315 | 7/1989 | Stopper | 361/428 |
| 4,847,732 | 7/1989 | Stopper | 361/395 |
| 4,864,165 | 9/1989 | Hoberman et al. | 307/467 |
| 4,873,506 | 10/1989 | Gurevich | 337/290 |
| 4,874,711 | 10/1989 | Hughes et al. | 437/8 |
| 4,876,220 | 10/1989 | Mohsen et al. | 437/170 |
| 4,881,114 | 11/1989 | Mohsen et al. . | |
| 4,882,611 | 11/1989 | Blech et al. . | |
| 4,888,574 | 12/1989 | Rice et al. | 338/309 |
| 4,888,665 | 12/1989 | Smith | 361/400 |
| 4,892,776 | 1/1990 | Rice | 428/209 |
| 4,893,167 | 1/1990 | Boudou et al. . | |
| 4,897,836 | 1/1990 | Fitzpatrick et al. | 370/112 |
| 4,899,205 | 2/1990 | Hamdy et al. | 357/51 |
| 4,910,418 | 3/1990 | Graham et al. | 307/465 |
| 4,914,055 | 4/1990 | Gordon et al. | 437/192 |
| 4,915,983 | 4/1990 | Lake et al. | 427/98 |
| 4,916,809 | 4/1990 | Boudou et al. | 29/852 |
| 4,920,454 | 4/1990 | Stopper et al. | 361/398 |
| 4,924,287 | 5/1990 | Orbach . | |
| 4,933,738 | 6/1990 | Orbach et al. . | |
| 4,935,584 | 6/1990 | Boggs | 174/262 |
| 4,937,475 | 6/1990 | Rhodes et al. | 307/465 |
| 4,943,538 | 7/1990 | Mohsen et al. | 437/52 |
| 4,949,084 | 8/1990 | Schwartz et al. | 340/825.83 |
| 4,964,948 | 10/1990 | Reed | 29/852 X |
| 4,969,124 | 11/1990 | Luich et al. | 365/201 |
| 4,974,048 | 11/1990 | Chakravorty et al. . | |
| 4,977,357 | 12/1990 | Shrier | 338/21 |
| 4,992,333 | 2/1991 | Hyatt | 428/402 |
| 5,003,486 | 3/1991 | Hendel et al. | 364/483 |
| 5,014,002 | 5/1991 | Wiscombe et al. | 324/158 F |
| 5,027,191 | 6/1991 | Bourdelaise et al. . | |
| 5,030,113 | 7/1991 | Wilson | 439/80 |
| 5,055,321 | 10/1991 | Enomoto et al. | 427/98 |
| 5,055,973 | 10/1991 | Mohsen | 361/414 |
| 5,060,116 | 10/1991 | Grobman et al. | 361/474 |
| 5,068,634 | 11/1991 | Shrier | 338/21 |
| 5,077,451 | 12/1991 | Mohsen | 174/261 |
| 5,087,589 | 2/1992 | Chapman et al. | 437/195 |
| 5,092,032 | 3/1992 | Murakami | 29/830 |
| 5,097,593 | 3/1992 | Jones et al. | 29/852 |
| 5,099,149 | 3/1992 | Smith | 307/465 |
| 5,099,380 | 3/1992 | Childers et al. | 361/56 |
| 5,106,773 | 4/1992 | Chen et al. | 437/51 |
| 5,120,679 | 6/1992 | Boardman et al. | 437/195 |
| 5,142,263 | 8/1992 | Childers et al. | 338/21 |
| 5,144,567 | 9/1992 | Oelsch et al. | 364/708 |
| 5,148,265 | 9/1992 | Khandros et al. . | |
| 5,148,355 | 9/1992 | Lowe et al. | 361/410 |
| 5,155,577 | 10/1992 | Chance et al. . | |
| 5,166,556 | 11/1992 | Hsu et al. | 307/465 |
| 5,181,096 | 1/1993 | Forouhi | 259/530 |
| 5,181,859 | 1/1993 | Foreman et al. | 439/225 |
| 5,189,387 | 2/1993 | Childers et al. | 338/20 |
| 5,196,724 | 3/1993 | Gordon et al. | 257/530 |
| 5,200,652 | 4/1993 | Lee | 307/465 |
| 5,210,940 | 5/1993 | Kawakami et al. | 29/852 |
| 5,218,679 | 6/1993 | Hasegawa et al. | 395/275 |
| 5,220,490 | 6/1993 | Weigler et al. | 361/409 |
| 5,229,549 | 7/1993 | Yamakawa et al. | 174/262 |
| 5,233,217 | 8/1993 | Dixit et al. | 257/530 |
| 5,248,517 | 9/1993 | Shrier et al. | 427/58 |
| 5,250,228 | 10/1993 | Baigrie et al. | 252/511 |
| 5,250,470 | 10/1993 | Yamaguchi | 437/211 |
| 5,258,643 | 11/1993 | Cohen | 257/530 |
| 5,260,519 | 11/1993 | Knickerbocker et al. | 174/262 |
| 5,260,848 | 11/1993 | Childers | 361/127 |
| 5,262,754 | 11/1993 | Collins | 338/21 |
| 5,264,729 | 11/1993 | Rostoker et al. | 257/774 |
| 5,282,271 | 1/1994 | Hsieh et al. | 395/275 |
| 5,282,312 | 2/1994 | DiStefano et al. | 29/830 |
| 5,287,620 | 2/1994 | Suzuki et al. | 29/852 |
| 5,300,208 | 4/1994 | Angelopoulos et al. | 205/50 |
| 5,311,053 | 5/1994 | Law et al. | 257/529 |
| 5,317,801 | 6/1994 | Tanaka et al. | 29/830 |
| 5,319,238 | 6/1994 | Gordon et al. | 257/530 |
| 5,321,322 | 6/1994 | Verheyen et al. | 307/465.1 |
| 5,329,153 | 7/1994 | Dixit | 257/530 |
| 5,346,750 | 9/1994 | Hatakeyama et al. | 428/209 |
| 5,347,258 | 9/1994 | Howard et al. | 338/333 |
| 5,349,248 | 9/1994 | Parlour et al. | 307/465 |
| 5,362,676 | 11/1994 | Gordon et al. | 437/192 |
| 5,367,764 | 11/1994 | DiStefano et al. | 29/830 |
| 5,377,124 | 12/1994 | Mohsen | 364/489 |
| 5,397,921 | 3/1995 | Karnezos | 257/779 |
| 5,404,637 | 4/1995 | Kawakami | 29/843 |
| 5,409,865 | 4/1995 | Karnezos | 437/210 |
| 5,410,806 | 5/1995 | Schneider | 29/840 |
| 5,420,456 | 5/1995 | Galbi et al. | 257/529 |
| 5,420,460 | 5/1995 | Massingill | 257/693 |
| 5,435,480 | 7/1995 | Hart et al. | 228/180.1 |
| 5,438,166 | 8/1995 | Carey et al. | 174/261 |
| 5,464,790 | 11/1995 | Hawley | 437/60 |
| 5,481,795 | 1/1996 | Hatakeyama et al. | 29/852 |
| 5,487,218 | 1/1996 | Bhatt et al. | 29/852 |

| | | | |
|---|---|---|---|
| 5,502,889 | 4/1996 | Casson et al. | 29/830 |
| 5,537,108 | 7/1996 | Nathan et al. | 340/825.84 |
| 5,572,409 | 11/1996 | Nathan et al. | 361/806 |

OTHER PUBLICATIONS

"An Enhanced Performance Low Cost BGA Package", Robert Marrs, etc., pp. 214–225.

"Dielectric Based Antifuse For Logic and Memory ICs", Esmat Hamdy, etc., IEEE, 1988, pp. 786–789.

"Printed Circuit Board Design Guidelines For Ball Grid Array Packages", Patrick Johnston, Motorola Inc., pp. 255–260.

"High–Performance Scalable Switch Design", Joshua Silver, ASIC & EDA, Jun. 1994, pp. 38–48.

"Advanced Single Poly BiCMOS Technology for High Performance Programmable TTL/ECL Applications", Ali Iranmanesh, etc., IEEE 190 Bipolar Circuits and Technology Meeting, 4 pages.

"Conducting Filament of the Programmed Metal Electrode Amorphose Silicon Antifuse", Kathryn E. Gordon, etc., IEEE, 1993, pp. 27–30.

"Interconnect Devices For Field Programmable Gate Array", Chenming Hu, IEEE, 1992, pp. 591–594.

"Antifuse Structure Comparison For Field Programmable Gate Arrays", Steve Chiang, etc., IEEE, 1992, pp. 611–614.

Vol. 3 "Alloy Phase Diagrams", ASM Handbook, AMP Incorporated, 4 pages.

"Interplay of Energies in Circuit Breaker and Fuse Combinations", Bernie DiMarco, etc., IEEE, 1991, pp. 1765–1769.

"Laser personalization of NMOS Digital Topologies", James B. Gullette, etc., International Symposium on Circuits and Systems, IEEE, May, 1983, pp. 1249–1252.

"I/O Buffering System to a Programmable Switching Apparatus", Wen–Jai Hsieh, etc., Official Gazette, Jan. 25, 1994, 1 page.

"Characterizing Quickturn ASICs: It's Done With Mirrors", Ron Iscoff, Semiconductor International, Aug. 1990, pp. 68–73.

"An Ultra High Speed ECL Programmable Logic Device", Fred Ki, etc., IEEE 1990 Bipolar Circuits and Technology Meeting, 4 pages.

"Distribution Fuses of Nearest Future", T. Lipski, 3rd International Conference on Future Trends in Distribution Switching Gear, 1990, pp. 41–45.

"An Advancement in the Design and Application of Current–Limiting Fuses", R. Ranjan, etc., General Electric Company, pp. 37–40.

"A Novel MOS PROM Using a Highly Resistive Poly–Si Resistor", Masafumi Tanimoto, etc., IEEE 1980, 4 pages.

"CMOS Resistive Fuse Circuits", Hei–seung Lee, etc., Department of Electrical Engineering and Computer Science, Massachusettes, pp. 109–110.

"CMOS Resistive Fuses for Image Smooting and Segmentation", Paul C. Yu, etc., Journal of Solid–State Circuites, vol. 27, No. 4, IEEE, Apr. 1992, pp. 545–553.

Letter to Hugo Goris, from J. Rapaille, Philips Components, dated Jul. 6, 1994, 2 pages.

"Process Considerations In Restructurable VLSI For Wafer- –Scale Integration", P.W. Wyatt, et al., IEDM, 1984, pp. 626–629.

"A Laser Linking Process For Restructurable VLSI", G.H. Chapman, et al., Massachusetts Institute of Technology, Lincoln Laaboratory, CLEO, Apr. 14–16, 1982, pp. 1–4.

METHOD AND STRUCTURE TO INTERCONNECT TRACES OF TWO CONDUCTIVE LAYERS IN A PRINTED CIRCUIT BOARD

CROSS REFERENCE TO RELATED APPLICATIONS

This application is related to U.S. patent applications Ser. No. 08/405,259, filed Mar. 14, 1995, Ser. No. 08/320,145, filed Oct. 7, 1994, and Ser. No. 08/374,941, filed Jan. 18, 1995, all of which are incorporated herein in their entirety.

FIELD OF INVENTION

This invention relates to a method of forming an electrical conductor in a substrate for supporting one or more electronic components and to the resulting structure. More particularly, this invention relates to forming an electrical conductor using a binding material and optional particles inside a printed circuit board, a printed wiring board, a multi-chip module or an integrated circuit package.

DESCRIPTION OF THE RELATED ART

In a printed circuit board, an electrical conductor (sometimes called a "via") connecting traces of two or more conductive layers (separated each from the other by one or more insulating layers) is typically formed by creating a via hole through the insulating layers and plating the via hole.

In creating via holes in a printed circuit board by mechanical drilling, small drill bits cost more than and wear faster than large drill bits. Mechanical drilling also requires, in a structure being drilled, a target area (sometimes called a "land") that is larger (typically 10 to 15 mils larger) than the drill bit's size, to account for possible misalignment during drilling. However, space used by vias and target areas limits the number of traces that can be formed in a given area of a printed circuit board.

Via holes having a small diameter, for example, in the 1 to 2 mil range can be created by focusing energy from a laser beam in a method called "laser drilling". However, laser drilling is expensive, and the hole's size and the laser's impact on the material are not reproducible. Laser drilling is described by T. F. Redmond et. al. in "The Application of Laser Process Technology to Thin Film Packaging" in 1992 Proceedings of 42nd Electronic Components Technology Conference (ECTC) pp. 1066–1071; and by J. M. Morrison et al. in "A Large Format Modified TEA CO2 Laser Based Process for Cost Effective Small Via Generation" in 1994 Proceedings of International Conference and Exhibition on Multichip Modules (ICEMCM) pages 369–377.

Via holes can also be formed in a structure by a dry etch process. However, for a dry etch process, the to-be-etched structure must be thin and small, as compared to structures drilled by a mechanical drilling process. See "Higher Density PCB's For Enhanced SMT and Bare Chip Assembly Applications" by Michael Moser et al., 1995 Proceedings of ICEMEM, pages 543–552.

In another process, via holes are formed through a photoimagable (i.e. light sensitive) dielectric layer, as described in U.S. Pat. Nos. 5,055,321, 5,097,593, and 5,092,032. However, in such a photoimagable process, adhesion between (1) the photoimagable dielectric layer and (2) the conductive material plated in the via holes can pose problems.

U.S. Pat. No. 5,428,190 describes the use of an anisotropic adhesive to form interconnects between a flex circuit and a rigid circuit. Interconnects can also be formed using a conductive polymer, as described in U.S. Pat. No. 5,300,208. Finally, interconnects can also be formed using an isotropic conductive paste, as described in U.S. Pat. Nos. 5,250,228 and 5,282,312.

As another method of connecting traces, Yusuke Wada et. al. in "A New Circuit Substrate for MCM-L" in the 1995 Proceedings of ICEMCM, at pages 59–64 disclose the use of a conductive paste to pierce through a core layer embedded with woven glass. See also, Kenji Tsuda in "Matsushita Team Eliminates Holes in High Density PCB" in *Nikkei Electronics Asia*, March 1995, pages 69–70.

SUMMARY

In accordance with this invention, a material, called a "micro filled via" material (or "MFV" material) includes a binding material and optionally includes a number of particles (between 0%–90% by volume) dispersed in the binding material. The binding material can be any material, such as a polymer that is either conductive or nonconductive. The particles can also be formed of any nonconductive or conductive material, such as a conductive polymer or a noble metal (e.g. copper or gold). In four alternative embodiments, the binding material and the particles are (1) both nonconductive, (2) both conductive, (3) respectively conductive and nonconductive, or, (4) respectively nonconductive and conductive.

Such a MFV material forms portions (also called micro filled vias) of a substrate (such as a printed circuit board (PCB), a printed wiring board (PWB), a multi-chip module (MCM) or an integrated circuit (IC) package) at one or more predetermined locations therein. In one embodiment, the locations are predetermined (i.e. determined before fabrication of the substrate) to be locations of to-be-formed electrical conductors passing through an insulating layer to connect two conductive layers or a conductive layer and a mounting pad, to implement a predetermined circuit.

An electrical conductor can be originally formed through a densely populated MFV material (e.g. a conductive paste with conductive particles occupying greater than 30% of the total volume) simply by contact between conductive particles located adjacent to each other, especially when the MFV material is subjected to pressure e.g. during lamination of various layers to form the substrate.

In an optional step, the micro filled via material can be subjected to a programming current (in a step called "programming") to lower the resistance of such an originally formed electrical conductor. During passage of a programming current, the particles carrying the current dissipate heat to the surrounding binding material. In one embodiment, the binding material has a melting temperature lower than that of the particles. As currently understood, the binding material softens on being heated in this manner and moves out from (1) between adjacent particles and also (2) between a conductive layer and the particles in contact with the conductive layer, thereby enlarging the respective contact areas and lowering the respective contact resistances.

In one embodiment, if a layer of oxide surrounds and separates the conductive material in two adjacent particles or if a layer of oxide separates a conductive layer and a particle adjacent the conductive layer, the passage of a programming current heats up and melts the oxide layer locally. Simultaneously, the conductive materials of the particle and the conductive layer also melt locally (because an oxide's melting temperature is typically higher than that of the material) and fuse with each other to form a link between the two particles or between the particle and the conductive layer. Therefore, in one embodiment, an electrical conductor in a densely populated MFV material is formed only of the materials of (a) one or more particles, and (b) the conductive layers.

An electrical conductor can also be originally formed in a MFV material by application of a programming voltage to break down any nonconductive material located between the particles into carbonized filaments (also called "links") that electrically couple the particles. Therefore, an electrical conductor shaped as a chain of particles and links can be formed by programming a MFV material, such as a sparsely populated MFV material, wherein the particles occupy less than 30% of the total volume. Such an electrical conductor, shaped as a chain of particles and links, can also be formed in a densely populated MFV material.

In a MFV material devoid of particles, wherein the binding material is formed of only one or more dielectric materials, an electrical conductor is originally formed through the MFV material only after programming by breakdown of the dielectric material into a carbonized filament connecting the two conductive layers. In another MFV material devoid of particles, wherein the binding material is formed of a conductive material (such as a conductive polymer), the electrical conductor is originally formed by simply placing the MFV material at the predetermined locations.

The MFV material can be placed at the predetermined locations in a number of holes (also called "via holes") in a dielectric layer located between the two conductive layers. In one embodiment, the dielectric layer is formed of a photoimagable material (i.e. a material that softens or hardens when exposed to light), and the via holes are formed by appropriate masking the dielectric, leaving unmasked the to-be-formed via holes and then exposing the unmasked to-be-formed via holes to light. In such an embodiment, the dielectric layer can be formed by any method, such as screen printing, curtain coating, roller coating, painting or spraying. In two alternate embodiments, the MFV material is placed in the via holes by stencil printing or by dispensing.

In another embodiment (called a "double screen method"), the MFV material can be placed on a conductive layer by stencil printing, or by dispensing, and the dielectric layer can be screen printed either before or after placing the MFV material, thus eliminating the use of a photoimagable material (as described above) and the associated cost.

Micro filled via material placement steps described above can be combined with other conventional steps of manufacturing a substrate, to provide micro filled vias (also called "MFVs") in the same substrate as other conventional elements, such as vias and traces. Hence, in a substrate having MFVs, conventional vias can be formed by mechanical drilling through one or more dielectric layers. In manufacturing such a substrate, the MFVs can be formed before, after or during one or more steps in which mechanically drilled vias are formed.

In one embodiment, a MFV material is screen printed inside holes of two dielectric layers formed on two sides of a core layer of a substrate. In this embodiment, the dielectric layers have a number of vias preformed by mechanical drilling and plating, and optionally filled with a conductive or non-conductive material to form a flat surface over the multi-layer vias. A conductive layer is then formed over each dielectric layer, and if necessary, additional multi-layer vias are drilled and plated at this time. Then traces are defined in the conductive layer and the micro filled via material is programmed if necessary.

In one embodiment, the conductive layer is formed by lamination of the copper foils to the dielectric layers. The steps of placing a MFV material in a hole and lamination result in traces having a substantially flat and contiguous surface over the MFVs. Such a flat contiguous surface is useful for formation of one or more additional layers, and for supporting a component's lead over the MFV if necessary.

The MFV material can also be placed in a substrate at a number of locations to form support members (called "dams"), that provide structural support. Specifically, such dams allow the structure being formed to maintain its shape during lamination of the conductive layers. Use of the MFV material to form dams allows dams to be formed in the same step as MFVs, thereby eliminating a separate dam formation step. Alternatively, if a separate dam formation step is used, dams can be formed of a material (such as a PCB core material) different from the MFV material.

Forming MFVs as described above results in electrical conductors of a small diameter (as compared to vias formed by a mechanical drilling process or a photoimaging process), thus allowing use of traces no wider than the MFVs' diameter. The small diameter of MFVs also allows reduced spacing between adjacent parallel traces as compared to prior art printed circuit boards.

Moreover such small MFVs also allow mounting pads (for supporting a component's lead) to be formed on a MFV and to be smaller than conventional mounting pads. Specifically, a mounting pad formed on a MFV can have approximately the same diameter as the MFV's diameter. Forming MFVs also eliminates the plating of a conductive layer around a via hole, thus eliminating (1) the processing steps, (2) the cost and (3) the waste treatment associated with plating.

Also, programming as described above results in uniform and low resistive electrical conductors, as compared to the use of unprogrammed MFV material. Therefore the use of a MFV material as described herein reduces the cost and size of PCBs, PWBs, MCMs and IC packages, as compared to prior art methods.

DETAILED DESCRIPTION

In one embodiment of this invention, a substrate such as a printed circuit board (PCB), printed wiring board (PWB), multi-chip module (MCM) or an integrated circuit (IC) package has a number of locations at which a corresponding number of electrical conductors are to be formed. The locations are predetermined before fabrication of the substrate, based on a predetermined circuit to be implemented in the substrate.

The electrical conductors are formed by placing a material, also called "micro filled via" material (MFV material) at each of the predetermined locations and optionally programming the MFV material after placement, as described below. The electrical conductors formed through the MFV material form essential and normal parts of a predetermined circuit implemented in a substrate of this invention.

Figure 1:
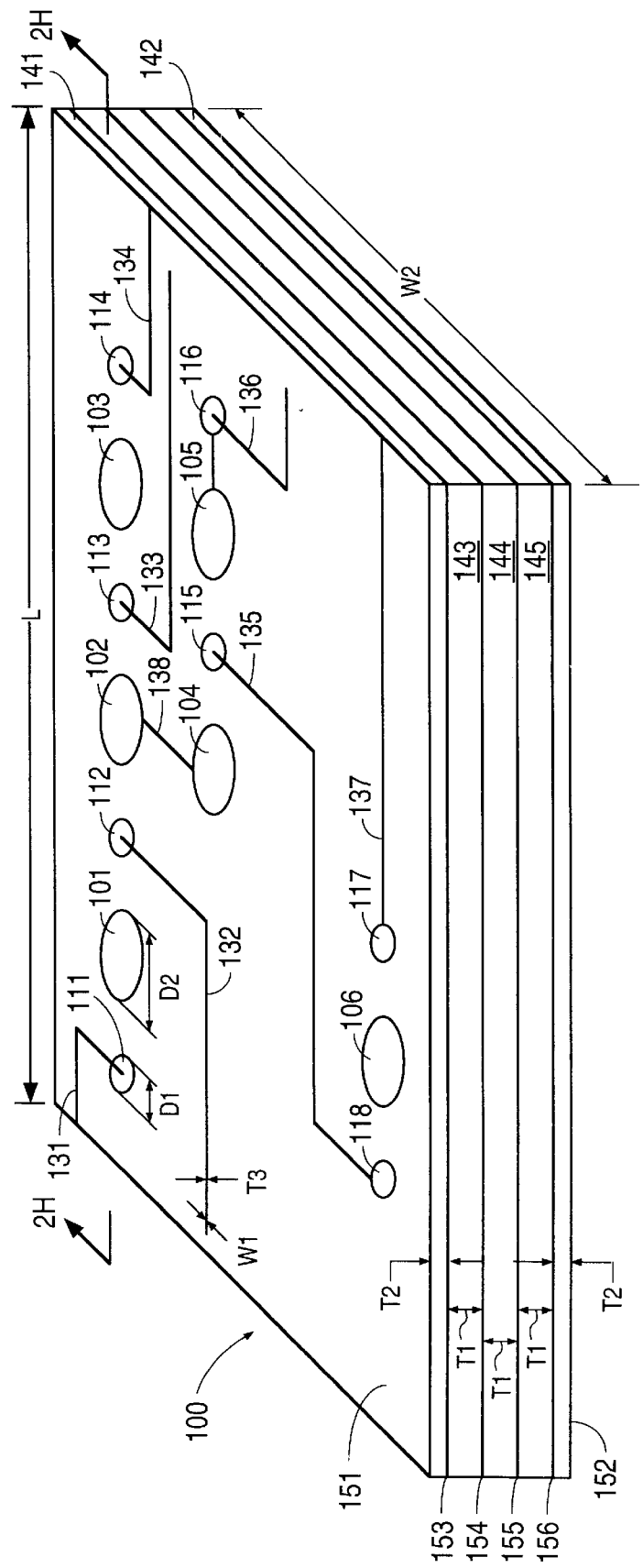
FIG. 1 illustrates in perspective view a multilayer printed circuit board having micro filled vias of this invention as well as mechanically drilled and plated vias.

FIG. 1 illustrates in a perspective view, a multilayered printed circuit board (PCB) 100 that has a number of mechanically drilled and plated vias 101–106 and a number of "micro filled" vias (MFVS) 111–118 in one embodiment of this invention. Micro filled vias 111–118 are formed in very small holes (having a diameter between 5 micron to 500 micron) of PCB 100 that are completely or substantially filled (more than 50% of the central region of a hole) with the MFV material.

In the embodiment illustrated in FIG. 1, each of MFVs 111–117 connect a surface trace formed on external surface 151 of dielectric layer 141 to a trace formed at one or more inner interfaces 153–156 between dielectric layers 141–142 of PCB 100. For clarity, the traces (also called "inner traces") located at each of inner interfaces 153–156 are not shown in FIG. 1.

Also, an inner trace (not shown) is connected by MFV 118 through surface trace 135 formed on dielectric layer 141 and MFV 115 to another inner trace (also not shown). Vias 101–106 are similarly connected to one or more traces, such as trace 138 formed on dielectric layer 141. Although a PCB 100 is illustrated in FIG. 1, other types of substrates (such as PWBs, MCMs and IC packages) can also have MFVs in accordance with this invention.

In the specific embodiment of FIG. 1, each of the dielectric layers 143, 144 and 145 has a thickness T1 of 2.5 mils, while photoimagable dielectric layers 141 and 142 have a thickness T2 of 2 mils. Also in this variant of the embodiment, MFVs 111–118 have a height of 2 mils and diameter D1 of 4 mils (formed by a stencil having holes of 2 mils diameter), vias 101–106 have a diameter D2 of 15 mils, and traces 131–138 have a width W1 of 4 mils (with space of 4 mils between parallel traces). Inner traces (e.g. at surfaces 153–156) can have width and space each (e.g. 3 mils width and 3 mils space) less than that of surface traces.

Hence, as compared to mechanically drilled vias with a diameter of 15 mils, such smaller diameter MFVs save space and reduce the number of layers that are needed to implement a predetermined circuit. Although MFVs 111–118 have a 4 mil diameter in this embodiment, MFVs in other embodiments can have a 6 mil diameter (formed by a stencil with holes of 4 mil diameter) or a 2 mil diameter (formed by a stencil with holes of 1 mil diameter).

PCB 100 illustrated in FIG. 1 can be formed by using one or more steps illustrated in FIGS. 2A–2H. Specifically, an insulating core layer 144 (FIG. 2A) having embedded woven glass fibers (or chopped glass fibers in an alternate embodiment) is laminated on two sides with electrically conductive foils (e.g. copper foils) not shown in FIG. 2A. The foils are printed and etched appropriately (depending on the predetermined circuit) to form traces 201A–201C and 202A–202C (FIG. 2A) for connections to, for example a voltage source or ground.

Figure 2A:
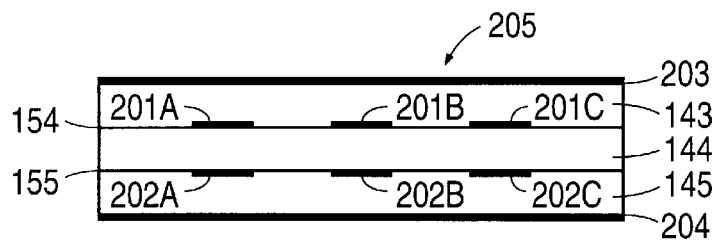
FIGS. 2A–2H illustrate cross-sectional views of various structures formed during fabrication of the printed circuit board of FIG. 1, using a photoimaging method of this invention.
Figure 2B:
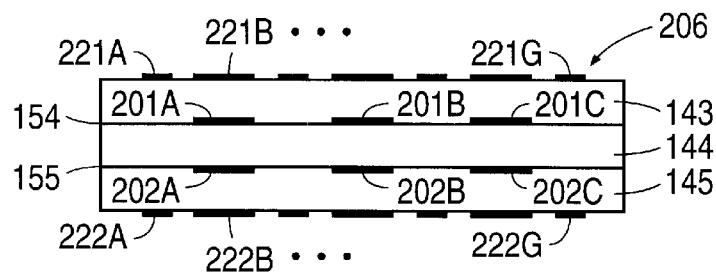
Figure 2C:
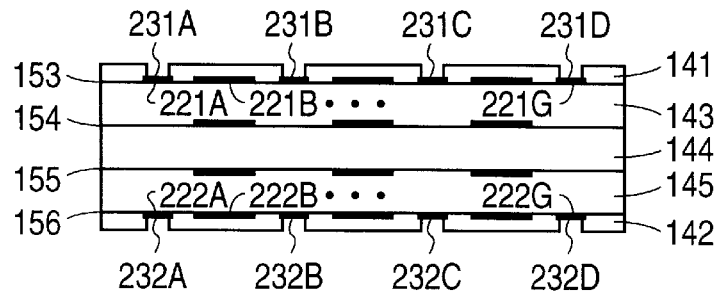

Then two prepreg dielectric (e.g. polymer) layers 143 and 145 are used to laminate foils 203, 204 (e.g. copper foils) and core layer 144 together to form structure 205 (FIG. 2A). Foils 203 and 204 of structure 205 are then printed and etched appropriately to form traces 221A–221G and 222A–222G in structure 206 (FIG. 2B).

To provide enhanced adhesion between copper traces 201A–201C, 202A–202C and prepreg layers 143, 145 respectively, traces 201A–201C, 202A–202C can be oxidized. Similarly traces 221A–221G, 222A–222G can be oxidized after the print and etch steps, to improve adhesion of these traces to the dielectric layers to be formed. Instead of such oxidizing, adhesion promoters, such as a layer of zinc (Zn), can be used as described below.

In an alternative embodiment, structure 206 (FIG. 2B) is replaced by structure 350 (FIG. 3B) formed from two cores 310 and 320 in parallel as follows. Traces 311A–311G, 312A–312C and 321A–321G, 322A–322C are formed simultaneously by printing and etching the copper layers on cores 310 and 320 (FIG. 3A) respectively. The resulting structures 315 and 325 are laminated together using a prepreg dielectric layer 330 (FIG. 3B). As compared to the steps illustrated in FIGS. 2A–2B, the parallel formation steps illustrated in FIGS. 3A–3B reduce the time needed to form structure 350. Then steps described below in reference to FIGS. 2C–2H can be performed on either structure 220 or structure 350.

Layers 141 (FIG. 2C) and 142 are then formed of a photoimagable dielectric material on layers 143 and 145, over the traces 221A–221G, 222A–222G. Dielectric layers 141, 142 are then imaged and developed to form holes (also called "photovia holes") 231A–231D, 232A–232D (FIG. 2C) at appropriate locations. In one embodiment, holes 231A–231D are formed at locations that have been predetermined (e.g. identified ahead of time as specific locations at which an electrical conductor is to be formed) for coupling traces 221A–221G with to-be-formed traces (e.g. traces 131–134 and 271–274 described below) on dielectric layer 141, to realize a predetermined circuit.

Figure 2D:
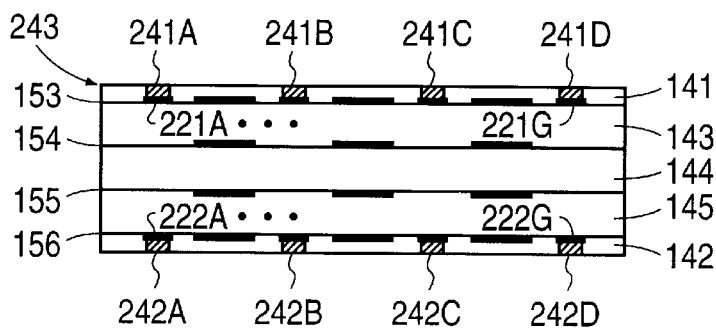
Figure 3A:
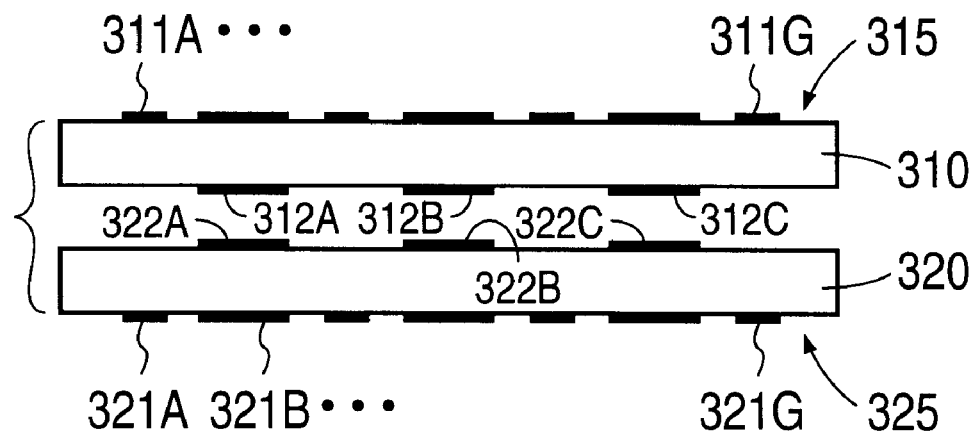
FIGS. 3A and 3B illustrate cross-sectional views of structures formed using another photoimaging method of this invention.
Figure 3B:
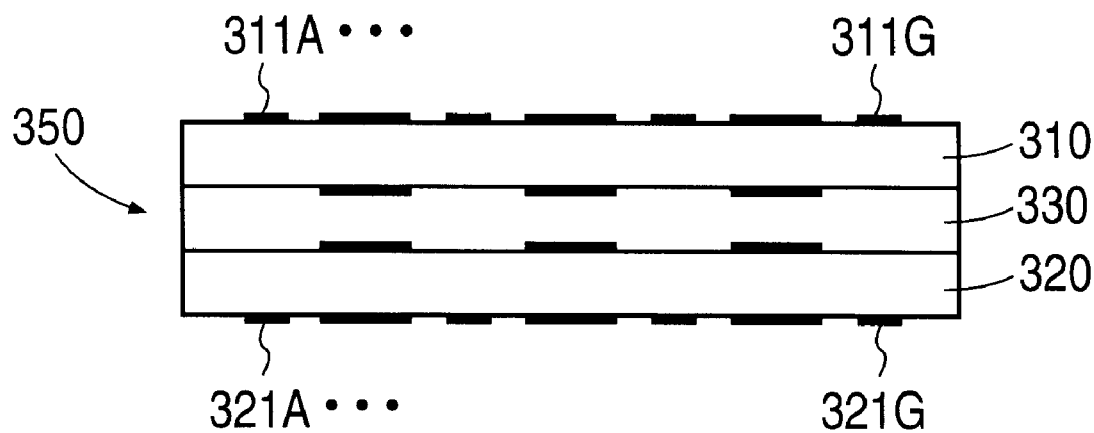

Then a micro filled via (MFV) material, such as a conductive material, a nonconductive material, or some combination of conductive material and nonconductive material (as described below) is placed (for example by dispensing or stencil printing) in holes 231A–231D and 232A–232D (FIG. 2C) to form micro filled vias (MFVs) 241A–241D and 242A–242D as shown in FIG. 2D. The dimensions of MFVs 241A–241D, 242A–242D are determined by the dimensions of the respective holes 231A–231D, 232A–232D described above. MFVs 241A–241D and dielectric layer 141 are together sometimes referred to herein as a compound layer 243 (FIG. 2D).

MFVs 241A–241D and 242A–242D are then partially cured and conductive layers 251 and 252 (FIG. 2E) are formed (in one embodiment by laminating copper foils on respective dielectric layers 141 and 142). Dielectric layers 141 and 142 can be left partially cured to a non-tacky surface condition (i.e. not hard baked), to improve adhesion during lamination.

A partially cured non-tacky surface can be formed by curing dielectric layers 141 and 142 to, for example, a B-stage condition that occurs prior to a fully cured condition in which all of the polymer is completely crosslinked. If the nontacky surface is not attained after partial cure, a nontacky layer of water soluble material (not shown) such as polyvinyl alcohol, can be applied on the dielectric layers 141 and 142 to form the nontacky surfaces. The nontacky layer can be made sufficiently thin and transparent, to avoid interference with the imaging step (described above). During the development step (described above) the nontacky layer dissolves in an aqueous developing solution.

Full curing of dielectric layers 141 and 142 before lamination can eliminate adhesion between the dielectric layer and the to-be-formed copper layers 251–252 (FIG. 2E), and is preferably avoided. Partial curing directions are available from manufacturers of dielectric materials. For example, Taiyo PSR-4000 can be partially cured at 80° C. for 15–20 minutes on a first side, followed by 25–40 minutes for the second side. Although in one embodiment, the dielectric layers are cured by heat treatment, curing can be done by other methods, such as ultraviolet (UV) treatment of a dielectric material sensitive to UV light.

In one embodiment, dielectric layers 141 and 142 are each formed of a mixture of Taiyo PSR-4000 and an adhesive (with the adhesive being 25% of total weight) as two 1 mil thick layers. In one variation of this embodiment, the adhesive is the polymer resin Epotek B9101-2 available from Epoxy Technology (below). One or more other polymers, such as epoxies, polyimide, or polyamic acids can be used as an adhesive in a dielectric layer. As dielectric layers 141 and 142 include an adhesive, these layers provide good adhesion to conductive layers 251 and 252 after lamination.

First, a 1 mil thick portion of each of dielectric layers 141 and 142 is formed and partially cured at 80° C. for 20 minutes, followed by formation of a second 1 mil thick portion for each of layers 141 and 142 and partial curing at 80° C. for 40 minutes. Although two 1-mil portions are used in this embodiment to form each of layers 141, 142, a single 2 mil thick or 4 mil thick layer can be formed for each of layers 141 and 142, using a mesh of the appropriate size (e.g. 4 mil or 8 mil respectively).

Adhesion between conductive layers 251 and 252 and the respective dielectric layers 141 and 142 can be improved by use of a thin adhesive layer, such as a polymer layer. A highly diluted polymer solution, for example, 10% by weight polymer (e.g. epoxy) and 90% by weight solvent (e.g. acetone) can be used to form an adhesive layer. Such an adhesive layer can be applied prior to lamination, either to foils 251 and 252 (FIG. 2D) or to the dielectric layers 141 and 142.

The adhesive layer can be applied (1) all over a foil (or layer) or (2) with a mask covering areas in which vias are formed. In one embodiment, the adhesive layer is applied all over and made sufficiently thin (e.g. less than 1 μm) to ensure that electrical conductors can be formed through the adhesive layer during programming (described below).

In this embodiment, each of copper foils 251, 252 has a matte side (also called "tooth side" e.g. the inner side of foil 252 adjacent layer 142) that is rougher than a shiny side (also called "drum side"). A zinc layer formed on the matte side helps to bond each of copper foils 251, 252 to the respective dielectric layers 141, 142. Copper foils with a zinc layer on the matte side are available from Polyclad Laminates, Inc., Franklin, NH and from Oak-Mitsui, Hoosick Falls, N.Y.

Also in this embodiment, an adhesive layer (such as an epoxy layer not shown in FIG. 2A) is formed on the matte side of copper foils 251, 252 over the zinc layer. During lamination, the zinc layer and the optional adhesive layer together bond copper foils 251, 252 to the respective dielectric layers 141, 142 and to the micro filled via material of MFVs 241A–241D (discussed below).

Next, holes 261–263 (FIG. 2F) are drilled through layers 141–145, 251–252, for example by a mechanical drilling process, and the inside surfaces of holes 261–263 are plated to form vias 101–103. Traces 131–134 and 271–274 (FIG. 2G) are then defined in copper layers 251 and 252 (FIG. 2F) respectively.

An electrical conductor having a resistance below a predetermined value may or may not be formed through the MFV material on simply placing the MFV material in a substrate. For example, an electrical conductor to connect one of traces 131–134 and a corresponding one of traces 221A, 221C, 221E and 221G respectively may not yet be formed, or may be formed with a high resistance. In such a case, an optional programming step can be used to lower a MFV's resistance. For example, passing a programming current between 1–10 amperes, at a programming voltage of 1–10 volts, through for example, MFV 241A (FIG. 2G), located between traces 131 and 221A, for a duration in the range of 0.1–10 milliseconds forms an electrical conductor (e.g. electrical conductor 111 in FIG. 2H) having a resistance approximately equal to or lower than the predetermined value (e.g. 0.1 Ω). Other electrical conductors 112–114 with a similar resistance can also be formed after such a programming step.

Figure 5C:
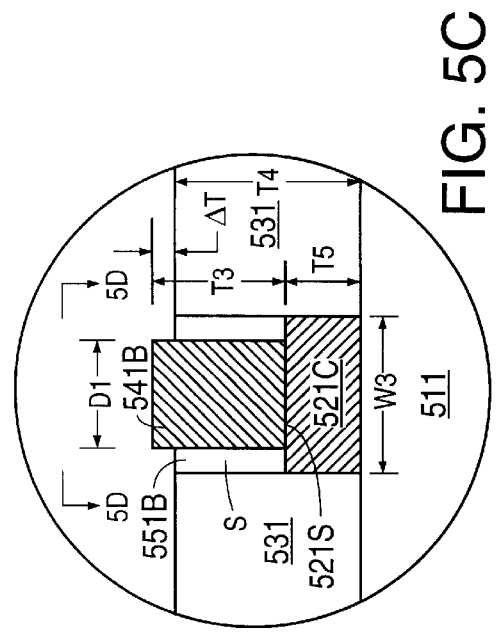
FIGS. 5A–5C and 5D illustrate respectively three cross-sectional views and a plan view (along direction 5D-5D in FIG. 5C) of structures formed using a screen printing method of this invention.
Figure 5D:
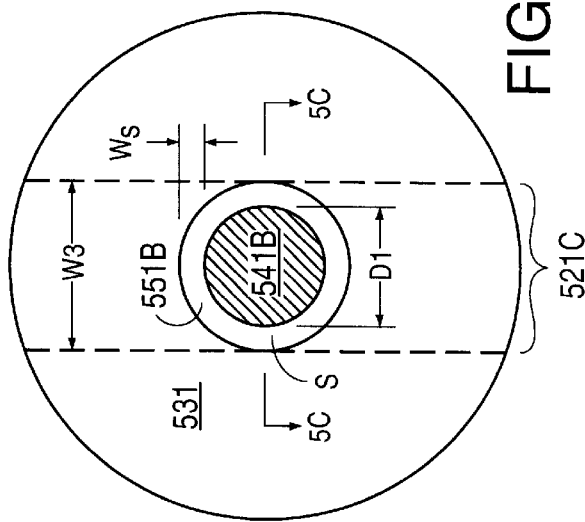
Figure 5A:
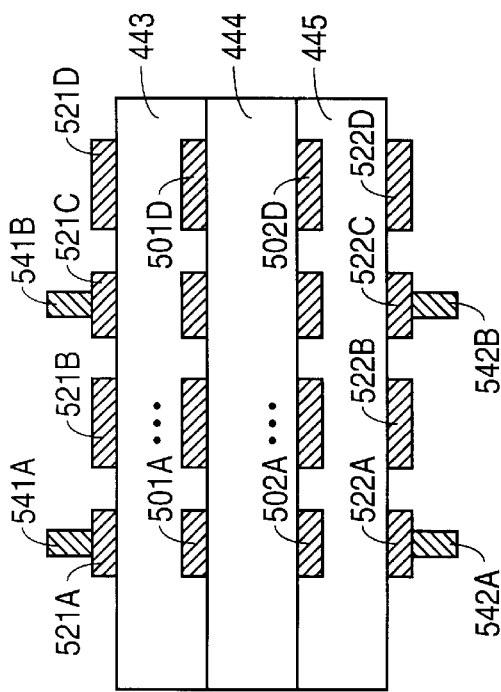
Figure 5B:
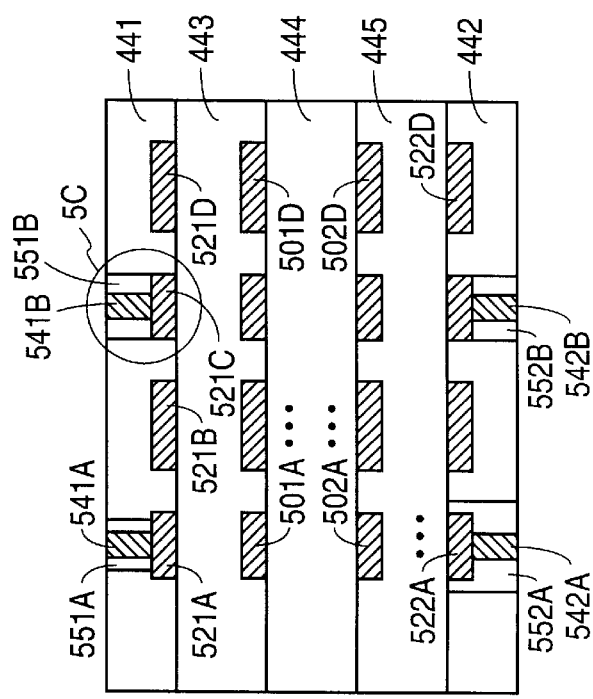

As holes 231A–231D and 232A–232D are filled in, and layers 251, 252 are laminated, outer surfaces 151 and 152 (FIG. 2H) are substantially flat (e.g. planar) locally over MFVs 111–114 (as compared to the outer surfaces overlying conventional vias). Moreover, the traces 131 and 221A (FIG. 2G) in contact with MFV 241A have a contiguous surface (described below in reference to FIG. 5D) over MFV 241A. Therefore, either structure 286 (FIG. 2H) obtained after programming or structure 285 (FIG. 2G) prior to programming can be used as a starting structure for another cycle of the steps illustrated in FIGS. 2C–2H.

Figure 4A:
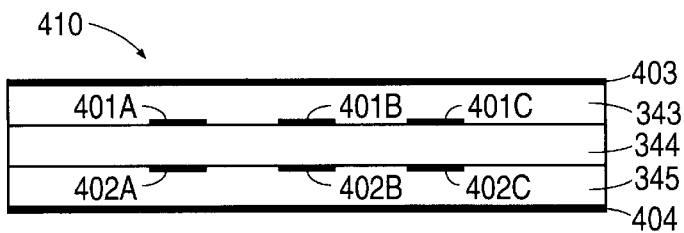
FIGS. 4A–4N illustrate cross-sectional views of structures formed in fabricating embedded mechanically drilled and plated vias in addition to micro filled vias in another method of this invention.

In another method for forming a substrate of this invention, one or more multi-layer holes 405–406 (FIG. 4B) are mechanically drilled in a structure 410 (FIG. 4A) that is similar to structure 205 described above. Many reference numerals in FIGS. 4A–4I were obtained by adding 200 to reference numerals in FIGS. 2A–2H which represent similar features.

Figure 4B:
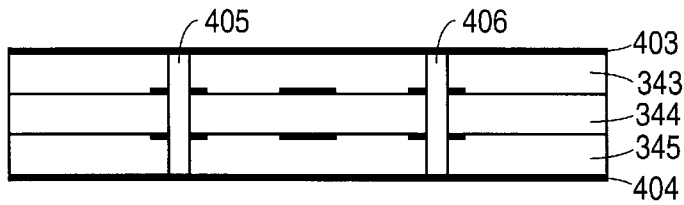
Figure 4C:
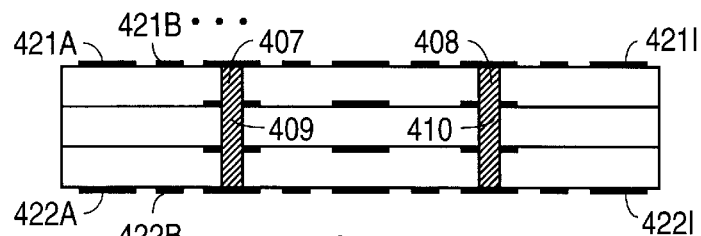
Figure 4D:
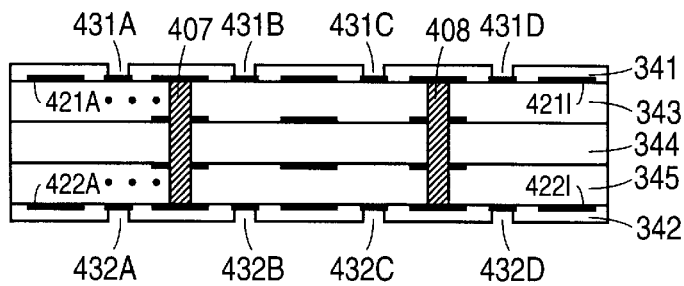
Figure 4E:
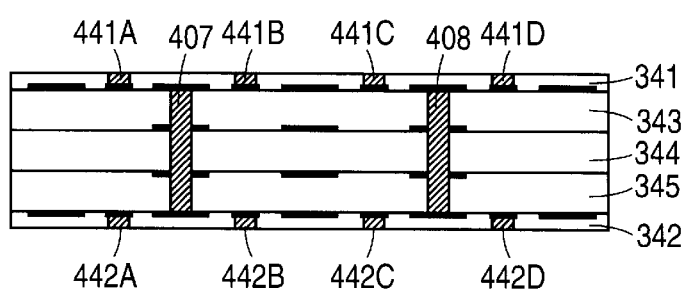
Figure 4F:
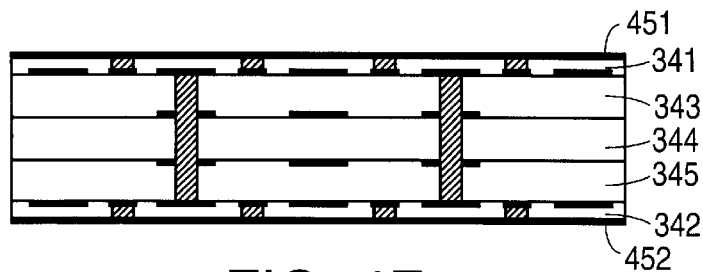
Figure 4G:
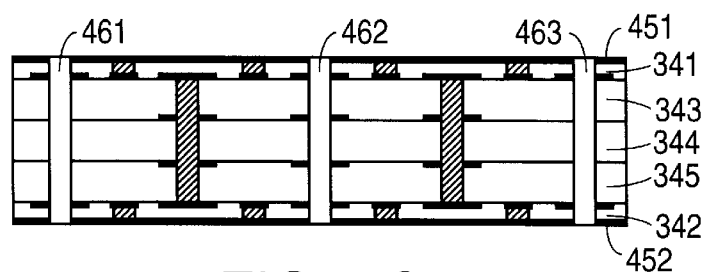

In an optional step (not shown) layers 403–404 can be reduced in thickness or even removed to expose the surface of dielectric layers 343–344 (for example by chemical etching, sandblasting, polishing or abrasive paste milling). Such reduction in thickness may be desirable because thickness of layers 403–404 can increase during the plating of via holes 405–406 (FIG. 4B).

After via holes 405–406 are drilled and their inside surfaces plated to form vias 407 and 408, such drilled vias 407 and 408 can be filled with conductive or non-conductive paste to form plugs 409 and 410 (FIG. 4C) and so create flat surfaces over via holes 405–406 for subsequent processing.

Copper layers 403–404 are then etched to define traces 421A–421I and 422A1–422I (FIG. 4C), photoimagable dielectric layers 341 and 342 (FIG. 4D) are then formed (similar to layers 141 and 142 shown in FIG. 2C), photovia holes 431A–431D and 432A–432D (FIG. 4D) are then formed (similar to holes 231A–231D and 232A–232D shown in FIG. 2C), and a MFV material is then placed in each of holes 431A–431D and 432A–432D, to form MFVs 441A–441D and 442A–442D (FIG. 4E) as described above in reference to FIG. 2D.

Next, conductive layers 451 and 452 (FIG. 4F) are formed on dielectric layers 341–342 (similar to FIG. 3E), and multi-layer holes 461–463 (FIG. 4G) are optionally drilled (for example, by a laser or a mechanical drill). Then, the inside surfaces of holes 461–463 are plated to form surface drilled vias 301–303 and conductive layers 451 and 452 are formed and etched to define traces 331–334, 471–474 (FIG. 4H), and electrical conductors 311–314 and 481–484 are formed, if necessary by programming MFVs 441A–441D and 442A–442D respectively, in the same manner as described above in reference to FIG. 2H.

Therefore, a number of multi-layer vias 407–408, 461–463 can be formed in the same structure 486 that also includes MFVs 311–314 and 481–484. MFVs 311–314 and 481–484 can be designed to carry normal currents (e.g. 100 mA–1 A) in the predetermined circuit, while embedded drilled vias 407–408 and surface drilled vias 461–463 can be designed to carry currents higher than normal, for example for connection to a voltage source or ground.

The process described above in reference to FIGS. 4A–4I permits a higher density of traces to be present on outer surface layers 351 and 352 (FIG. 4I) than possible by a prior art process, because drilled vias 407–408 are embedded in structure 486, i.e. vias 407 and 408 are not present on outer surfaces 351 and 352, and therefore do not take up surface space which can be used for additional traces on surfaces 351–352.

Figure 4H:
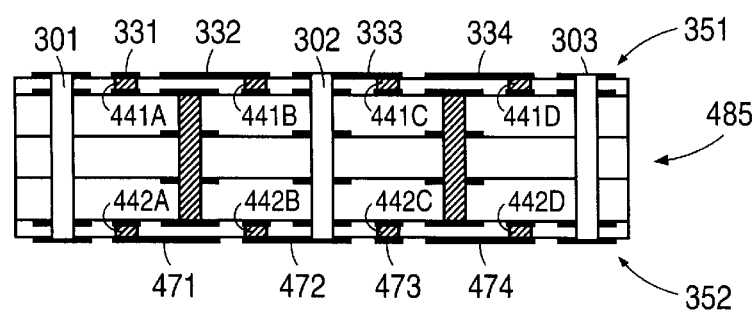
Figure 4I:
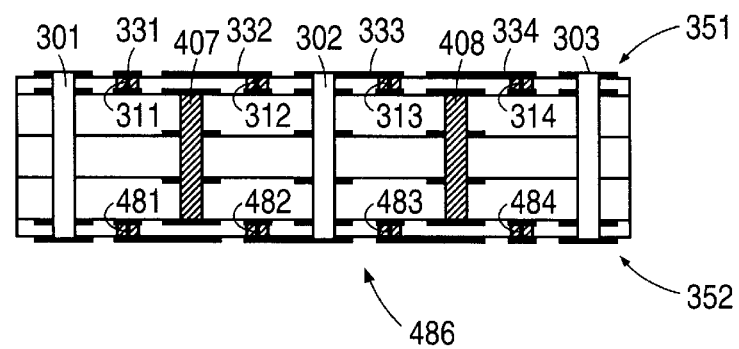
Figure 4J:
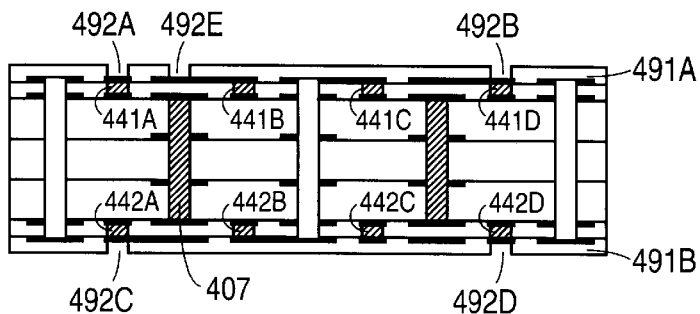

In one embodiment, conductors 311–314, 481–484 and embedded drilled vias 407–408 (FIG. 4I) are adequately thick to carry all currents in a circuit (including currents to and from a power source or ground), so surface drilled vias 301–303 are not formed at all, thereby allowing the substrate to be made smaller than structure 485 (FIG. 4H). In another embodiment, traces and MFVs are sufficient to form the predetermined circuit, and both types of drilled vias 301–303 and 407–408 are not formed, thereby allowing such a substrate to be made even smaller.

The MFVs described herein can be formed at any predetermined location, in any combination with the drilled vias. For example, two or more MFVs can be stacked over each other, to pass through a number of dielectric layers and connect, for example, an inner layer trace to a mounting pad for supporting a lead of an electronic component. Specifically, FIGS. 4J–4N illustrate another cycle of steps similar to those described above in reference to FIGS. 4A–4H, but repeated on surfaces 351–352 of structure 485 (FIG. 4H) to form stacked MFVs and mounting pads.

Photoimagable dielectric layers 491A–491B (FIG. 4J) are formed on structure 485 and imaged to form holes 492A–492E. In this embodiment holes 492A–492E are formed at approximately the same locations as holes 431A, 431D, 432A and 432D respectively, while hole 492E is formed at a different location. MFVs 493A–493E (FIG. 4K) are then formed by placing a MFV material into holes 492A–492E, and conductive layers 494A, 494B (FIG. 4N) are formed over dielectric layers 491A, 491B.

Then traces 495A–495F (FIG. 4M) are defined and some or all of MFVs 441A–441D, 442A–442D, 493A–493D are programmed. MFVs 493A and 441A together form a single electrical conductor 496A (FIG. 4N) that connects trace 495A to trace 421B. Therefore, electrical conductor 49GA is a multilayer electrical conductor that connects two traces 495A, 421B separated by dielectric layers 491A and 341. Similarly, electrical conductors 496B–496D are multilayer electrical conductors formed by stacking MFVs on each other in adjacent layers.

Although holes 492A–492D have been described as being formed over MFVs 441A, 441D, 442A and 442D for stacking the MFVs, such holes can be formed at any other predetermined locations in dielectric layers 491A and 491B where electrical conductors need to be formed to implement a predetermined circuit. For example, hole 492E is formed in layer 491A (FIG. 4J) to form a MFV 493E (FIG. 4K) over embedded via 407.

Figure 7A:
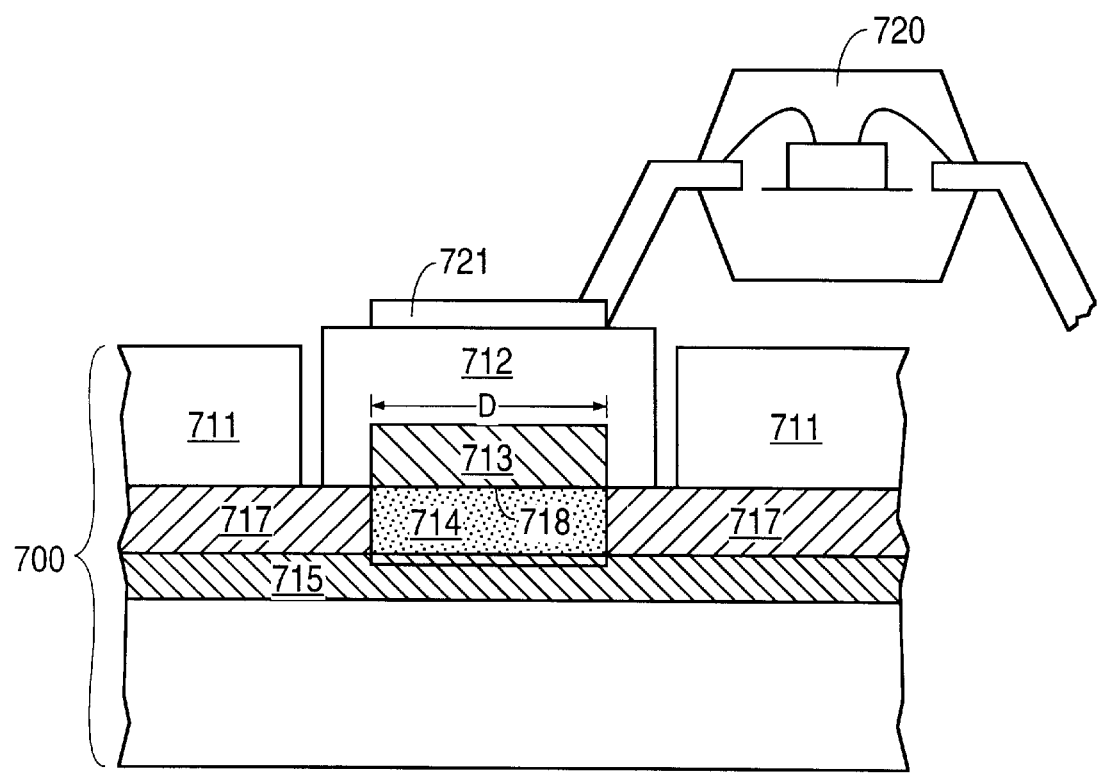
FIG. 7A illustrates a cross-sectional view of a component's lead supported on a micro filled via having a flat surface.

In this particular embodiment, a pad 495E (FIG. 4M) is formed in contact with MFV 493E, and MFV 493E can be programmed to form electrical conductor 496E. For example, a programming voltage can be applied between pad 495E and trace 431B to form electrical conductors 312 and 496E at two different locations simultaneously, because MFVs 493E and 441B are coupled to each other by trace 332. Pad 495E can be used to support the lead of an electronic component as described below in reference to FIG. 7.

Use of MFVs and embedded vias (e.g. vias 407 and 408 in FIG. 4I) as described herein makes routing of traces in a substrate easier, and if necessary denser, than in prior art substrates. Therefore, as compared to using prior art vias, use of MFVs results either a reduction in the number of layers (and hence a lower cost), or in a smaller substrate with shorter trace lengths from component pads to a given layer (again a lower cost).

In another embodiment, instead of using a photoimagable dielectric material and the steps described above in reference to FIGS. 2C and 2D, other dielectric materials which are not photoimagable (such as Epotek's material HG5-175MP) are used in a double screen method described below in reference to FIGS. 5A–5D. Many reference numerals in FIGS. 5A–5D are obtained by adding 300 to reference numerals in FIGS. 2A–2B which represent similar features.

In one embodiment, a structure similar to structure 220 (FIG. 2B) is formed and MFV material is printed in a first screen step through a stencil screen (not shown) to form MFVs 541A, 541B and 542A, 542B. Then, dielectric material is printed in a second screen step through another stencil screen (not shown) to form dielectric layers 441 and 442 (FIG. 5B) that surround MFVs 541A, 541B and 542A, 542B respectively.

In one embodiment, an annular space S (FIG. 5C and 5D) is left in the hole 551B in dielectric layer 441 surrounding MFV 541B. Annular space S allows room for misalignment in the two screen steps described above. Annular space S is partially or completely eliminated during lamination of copper foils to outer surfaces of layers 441 and 442 (described above in reference to FIG. 2E), depending on the difference $\Delta T$ in thickness between MFV 541B and the surrounding dielectric layer 531. Specifically, annular space S is completely filled on lamination of copper foils (illustrated by FIG. 2E) if its volume $\pi(T3-\Delta T)[(W3/2)^2-(D1/2)^2]$ is equal to or less than $\pi \Delta T (D1/2)^2$.

In one specific embodiment, annular space S is 1–2 mils wide, MFV 541B has a thickness T3 of 3–4 mils and a diameter D1 (above), dielectric layer 531's thickness T4 is 2 mil, thickness difference ΔT is about 1–2 mils, trace 521C has a thickness T5 of 0.7 mil and a width W3 of 8 mils. Although trace 521C has the same width W3 as the diameter of hole 551B (FIG. 5D), other traces and holes can have different dimensions. For example, in FIG. 5B, trace 521A is wider than hole 551A and trace 552A is narrower than hole 552A. Depending on the specific predetermined circuit to be implemented, a wide trace can be used if for example the trace's resistance is a constraint, while a narrow trace can be used if for example capacitance or hole diameter is a constraint.

In this embodiment, trace 521C's surface 521S in contact with MFV 541B is contiguous (i.e. continuous, unbroken and devoid of any holes) and substantially flat. Moreover, surface 521S remains substantially flat after lamination, thereby facilitating further processing (as described above for forming stacked MFVs, or as described below for mounting a component lead).

The two screen steps described above in the double screen method can be performed in reverse order, i.e. dielectric layers 441 and 442 can be screen printed first with holes for vias 541A, 541B, 542A and 542B, and then the MFV material is screen printed into these holes through a stencil screen. Moreover, in either of these two methods, the MFV material can be dispensed instead of being stencil printed.

In the double screen methods described above, the dielectric layers 441, 442 are not fully cured prior to lamination of copper foils (illustrated by FIG. 2E) and the thickness of these dielectric layers can change during the lamination step.

Figure 6A:
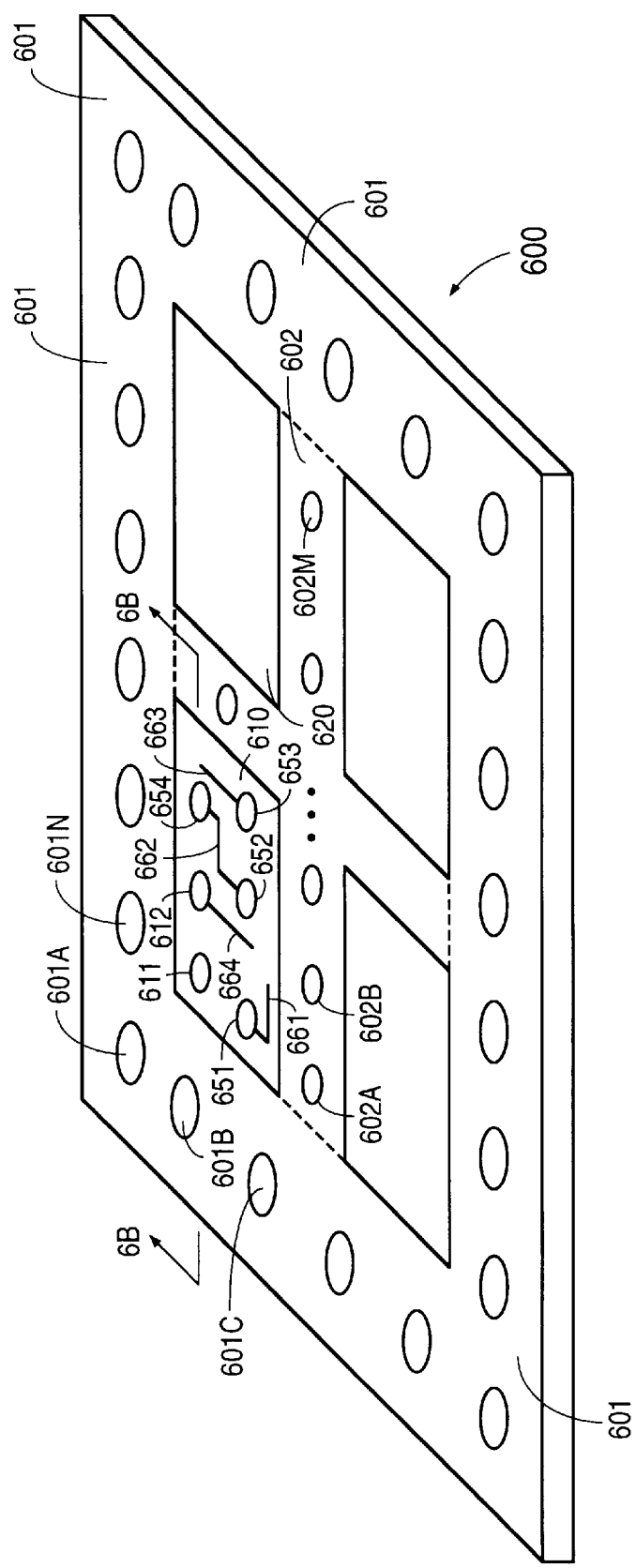
FIGS. 6A and 6B illustrate a cross-sectional view and a perspective view of a structure including dams formed in a screen printing method of this invention.
Figure 6B:
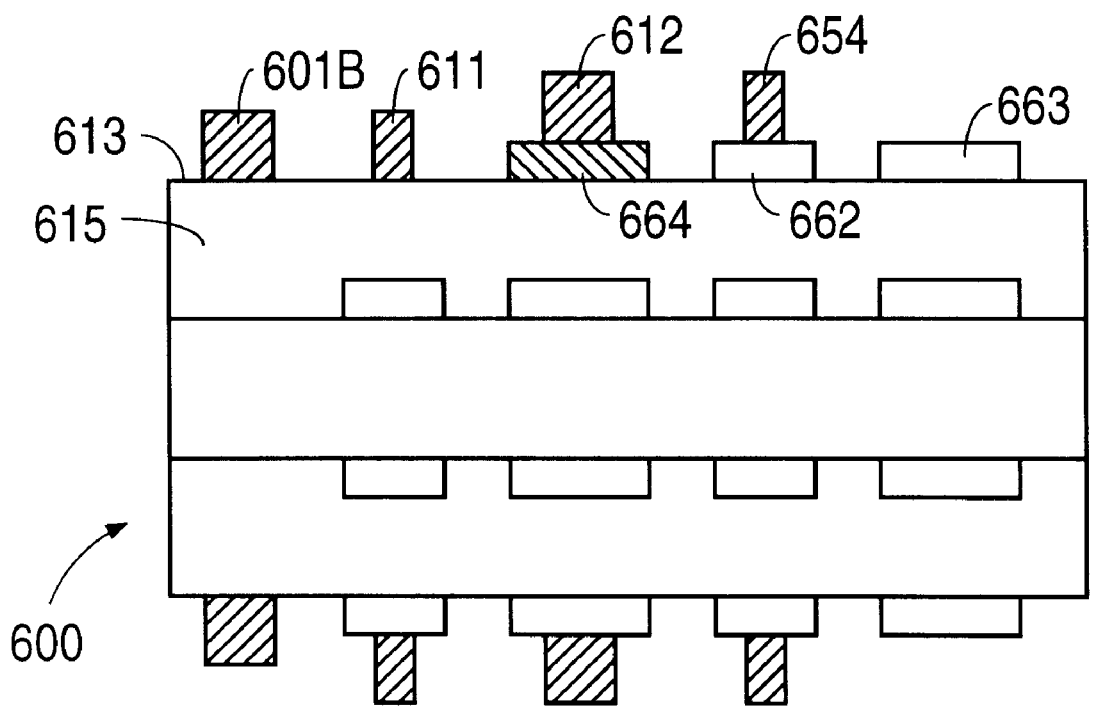

Substantial uniformity in the thickness of a dielectric layer after lamination can be ensured by using one or more structural support members called "dams", such as dams 601B, 611 and 612 in FIGS. 6A–6B. For clarity, all dams are not labeled in FIGS. 6A–6B. Dams can be formed (for example by dispensing or stencil printing) on panel 600 in any areas not used to form printed circuit boards. For example, dam 601B is one of many dams 601A–601N (where N is the number of dams) located in an edge area 601 around panel 600. In another embodiment, instead of dams 601A–601N, a single "window frame" shaped dam (not shown) is formed to cover the entire edge area 601.

If there is little adhesion between a window frame shaped dam (e.g. formed of core material) and a laminated copper foil (not shown in FIGS. 6A and 6B), any clearance between the dam and a copper foil traps solution from a bath (not shown) in which such a structure is dipped (e.g. during the next step), and the trapped solution can pose problems in subsequent processing steps. Such trapped solution problems are minimized if dams are formed in a cylindrical shape, for example, as a number of cylinders in edge area 601. When cylindrical dams are used, the dielectric material surrounding a cylindrical dam forms a seal with the laminated foil to enclose the dam.

Use of a MFV material to form dams eliminates a separate step for forming dams because dams can be placed in the same step as the MFVs. In one embodiment, the MFV material of the MFVs and the dams is dried (i.e. cured) before the surrounding dielectric layer is formed.

Another example is dam 611 formed in printed circuit board (PCB) 610 in an area devoid of a via and a trace. Yet another example is dam 612 formed on a trace 664. If dam 612 is formed of a conductive material, trace 664 is not used in forming the circuit being implemented in PCB 610. Similarly, a dam of a conductive material is not formed over traces 661–663 used to implement the circuit.

Still other examples are dams 602A–602M (where M is the number of dams) formed within a board routing area 602 to be discarded when panel 600 is routed (i.e. divided) into several PCBs 610–640.

Dams can be formed in any size and any shape necessary to allow the surrounding dielectric material to withstand compressive forces during lamination. For example, dam 601B is cylindrical in shape, with a diameter of 25 mils. and a height same as the height (e.g. 2 mil) of MFVs 651–654. To maximize the uniformity in thickness of the dielectric layer, dams of a larger diameter are preferable (as compared to smaller diameter dams).

Dams 601A–601N, 611, 612 and 602A–602M can be formed of prepreg material or of a MFV material. Glass fibers inside a prepreg material or particles inside a MFV material provide compressive strength to a dam and so allow the thickness of the surrounding dielectric layer to be substantially uniformly planar over panel 600. Fully cured core material can also be used as dam material. Such core material can be placed as a window frame after the dielectric material is screened (or developed if the dielectric material is photoimagable) around the dielectric layer.

As a MFV's top surface is flat, a component pad (sometimes called a "mounting pad") can be formed over a MFV to support a component. For example, in PCB 700 (FIG. 7A), MFV 714 is located on a trace 715 and has a flat surface 718 on which is formed a pad 713. Moreover, Pad 713 has a flat contiguous surface, the same center and diameter D (e.g. 2 mil) as that of MFV 714, and a thickness T (e.g. 0.7 mil), the same as that of layer 715.

Pad 713 is formed by lamination of a copper foil followed by print and etch steps. Then solder mask 711 is formed by screen printing, imaging, developing and fully curing a photoimagable solder mask material (such as PSR 4000). Solder 712 is then formed over pad 713 by hot air solder leveling. Next PCB 700 is heated to melt solder 712, so that solder 712 bonds lead 721 of a component 720 to pad 713 that in turn is connected by MFV 714 to inner trace 715.

The MFV material of this invention includes a binding material and optionally includes a number of particles in any percentage loading (for example, between 0% to 60% by volume). In one embodiment, the MFV material is a conductive paste formed of a binding material densely populated with conductive particles (forming more than 30% of the total volume so that a majority of the particles touch each other). In another embodiment, the MFV material is a dielectric composite wherein the binding material is nonconductive and is sparsely populated with conductive particles (forming less than 30% of the total volume so that a majority of the particles are isolated and insulated from each other). The initial resistivity of a sparsely populated MFV material prior to programming is typically close to that of the binding material (for example, $10^{15}$ ohm.cm. if a polymer is used as the binding material).

When the volume percentage of the conductive particles approaches a critical volume Vc, the resistivity of the MFV material can change by up to ten orders of magnitude for a small increase in the fraction of the conductive particles, as described in, for example, "Critical Volume Fractions In Conductive Composites" by G. R. Ruschan and R. G. Newnham, Journal of Composite Materials, Vol. 26, No. 18, 1992, that is incorporated herein in its entirety.

In two embodiments, the MFV material is an isotropic conductive paste, such as (1) paste PC5905 or PC5328 available from Heraeus Corporation, West Conshohocken, Pa. and (2) paste number 101G available from Alpha Metals Corporation, Jersey City, N.J. The MFV material can also be an isotropic conductive paste made of 0%–60% by volume silver particles (available from DeGussa Corporation, South Plainfield, N.J.) with an average size of 5 µm–10 µm dispersed in 40%–100% by volume epoxy polymer (called "PL2") formed by mixing the following materials available from Applied Polermaric, Inc. (API), Benicia, Calif.: 750 g of DEN 438 (manufactured by Dow Chemical Company), 100 g–2000 g of DER 332 (also manufactured by Dow), 250 g of ERL 0505 (manufactured by Ciba-Geigy) 120 g of Dicy (manufactured by Air Product), 20 g of AMI cure (manufactured by Air Product).

In another embodiment, the MFV material is made of 0%–60% by volume silver particles of average size (e.g. diameter) 5 µm–10 µm size dispersed in 40%–100% polymer and 1%–5% solvent diethyleneglycolbutylether (from Aldrich Chemical Company, Milwaukee, Wis.). In still another embodiment, the MFV material is made of 0%–60% by volume copper particles with average sizes of 10 µm–20 µm (from Aldrich Chemical Company, Degussa Corporation, or U.S. Bronze Powders, Inc., P.O. Box 31, Route 202, Flemington, N.J. 08822) dispersed in 40%–100% by volume epoxy polymer formed by mixing the following materials available from API: 400 g of DER 332 (manufactured by Dow), 100 g of DEN 438 (manufactured by Dow), 35 g of DY 9577 (manufactured by Ciba-Geigy), 2 g of IRGACURE 1171 (manufactured by Ciba-Geigy), 100 g of SR 350 (manufactured by Sartomer) and 50 g of CYRACURE (manufactured by Union Carbide).

In another embodiment, the MFV material is an anisotropic conductive paste available from Sheldahl Corp., Northfield, Minn. under the tradename Z-Link®. Commercially available conductive pastes from Epoxy Technology Corporation, Grace Co., Alpha Metals, Inc. or Ablestik can also be used as MFV materials.

In still another embodiment, the MFV material is a single phase nonconductive material devoid of any conductive particles but otherwise the same as one or more of the isotropic conductive pastes discussed above.

In two alternate embodiments, the MFV material is a single phase dielectric material, such as (1) Epotek H65-175MP, available from Epoxy Technology Corporation, Billerica, Mass., (2) a mixture of 8% PL2 (above) and 5–15% CAB-O-SIL™ (from Applied Polermaric Inc.).

In a number of embodiments, the binding material included in a MFV material has a lower breakdown voltage than the surrounding dielectric layer. In one specific embodiment, the MFV material has a breakdown voltage less than 1 volt while the surrounding dielectric layer has a breakdown voltage in excess of 100 volts. Such a MFV material can include a fluoro polymer such as TEFLON™ as the binding material.

A MFV material can include a nonconductive polymer, such as polyimide, epoxy or cynate ester as the binding material. In other embodiments, the binding material is a conductive material, such as a conductive epoxy resin of the type described in U.S. Pat. No. 5,300,208 that is incorporated by reference herein in its entirety. A MFV material including conductive particles dispersed in such a conductive epoxy resin has a lower resistance than a conductive epoxy resin devoid of conductive particles.

In various embodiments, the MFV material can include a thermosetting one stage or two stage polymer as the binding material. Thermal fillers (such as silica, alumina, aluminum nitride), antioxidant (such as silica) or thermoplastic materials can also be used with thermosetting materials to form the binding material included in a MFV material.

Use of one or more solvents (e.g. 1–5% by volume in a MFV material (as described above) ensures uniform mixing and a low rate of evaporation needed for stencil printing. Solvents also allow a large loading (beyond 50% by weight) of the particles. Solvents in a MFV material can be, for example, diethylene glycol, diethylene glycol mono hexaether, 2-Butoxy ethanol, acetone, chlorofoam, tetrahydrofuran, vinyl acetate, acrylonitrile, ethyl acetate, methyl ethyl ketone, ethyl alcohol, acetonitrile, ethylene glycol dimethyl ether, dioxane, toluene, methylisobuthyl ketone, methyl cellosolve (2-mehoxyethanol), xylene, stylene, dimethylformanide, cyclohexane, diethylene glycol dimethyl ether, dimethyl sulfoxide, N-methyl-2-pyrrolidone, butyl cellosolve acetate (ethylene glycol monobutyl ether acetate), butyl carbitol acetate (diethylene glycol monobutyl ether acetate) and dimethyl phthalate.

A MFV material can also include a coupling agent to improve the metal-to-polymer adhesion of the MFV to be formed. In one embodiment, the MFV material includes, as a surface active coupling agent, a quantity of titanate equal to about 0.5% by weight of the conductive particles in the MFV material. In other embodiments, titanate can be added in smaller amounts, such as 0.1% by weight of the conductive particles and still be effective as a coupling agent. Use of a coupling agent is preferred for a MFV material having a low concentration of conductive particles to ensure uniformity in distribution of these particles in the MFV material. In one specific embodiment, the coupling agent is LICA38, available from Kenrich Petrochemicals, Inc., 140 East 22 St., Bayonne, N.J. 07002.

A MFV material can also include a degassing agent to reduce or eliminate the release of bubbles during curing of the MFV material. In one specific embodiment, the degassing agent is BYK-A 530, available from BYK Chemie USA, Wallingford, Conn.

In various embodiments, the conductive particles included in a MFV material are made of copper or silver, shaped as spheres or flakes, with sizes in the range of 1–20 µm. As compared to particles of a smaller size and higher resistivity, particles of a larger size and lower resistivity are preferred for inclusion in a MFV material. Therefore, to form MFVs predetermined to carry larger currents than normal currents in the predetermined circuit, conductive particles formed of low resistivity metals, for example, silver, gold, copper, nickel, palladium and platinum can be used in the MFV material.

The conductive particles are also preferably made of low melting temperature materials to promote a better connection between two adjacent particles. Therefore the conductive particles can be formed of, for example, lead/tin compound, silver/tin compound, tin and nickel/tin.

A material of a low melting temperature can have high resistivity and a material of a low resistivity can have a high melting temperature. Hence, each particle of a MFV material can include an inner core of low resistivity, high melting temperature material enclosed by an outer layer of a high resistivity, low melting temperature material. During programming of a MFV material having such particles, the outer layer of each particle in a conductive path melts and promotes contact between adjacent particles, or between a particle and a conductive layer. After programming, the electrical conductor is formed primarily of the inner core material which has a low resistance. In such a particle, the inner core material can be, for example, copper, silver, silver/tin, and palladium while the outer layer material can be, for example, lead/tin alloy, silver/tin alloy and tin metal.

If the current carrying capacity of an electrical conductor to be formed is not critical, the MFV material's particles can be formed of low melting temperature materials, such as silver/tin, lead/tin and tin. In two alternate embodiments the conductive particles are formed with an inner copper core, and an outer layer of silver or gold.

Particles formed with an inner core of polymer and an outer layer of silver can also be used in a MFV material. Alternatively, the particles can be formed with an inner core of any conductive material (e.g. a metal such as nickel, copper or silver) and an outer layer of any non-conductive material (e.g. a polymer), if the MFV material is programmed to breakdown the outer layer.

The particle size and shape can also be selected depending on predetermined characteristics of the to-be-formed electrical conductor. A particle in a MFV can be shaped as a sphere, a rod, a spike or a flake. In one embodiment, spherical particles are mixed uniformly in the MFV material. For a given percentage loading, high surface area particles such as irregular shaped particles (e.g. flakes), provide a higher probability of contact and a larger area of contact than possible by using uniform sized spherical particles.

The particles' size can be chosen so that the particles remain unagglomerated and yet are smaller than the diameter of the hole in which the MFV material is to be placed. As compared to smaller particles, larger particles provide a higher current carrying capability to the to-be-formed electrical conductor. Therefore, for a via hole with a 1–2 mil diameter and a 1–2 mil height, the preferred particle size (e.g. diameter of a spherical particle) is between 1 $\mu$m to 20 $\mu$m.

Figure 7B:
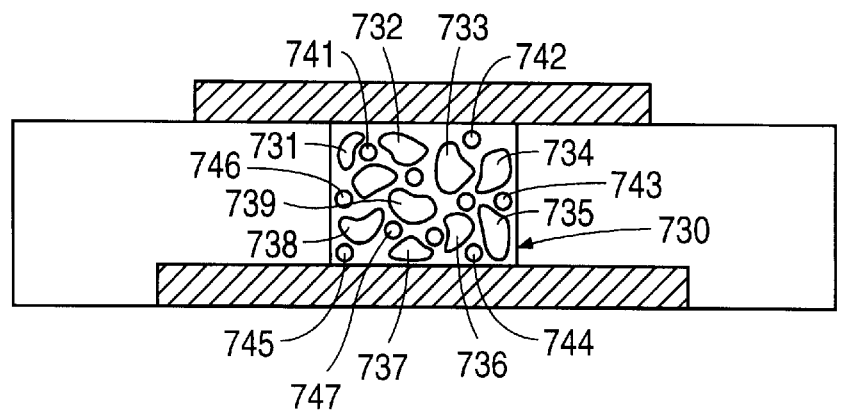
FIG. 7B illustrates a cross-sectional view of a micro filled via formed of a number of irregular shaped particles and spherical particles dispersed in a binding material.

To ensure that the MFV material's initial resistance is low and the loading is high, nonuniform-sized particles, such as a combination of large sized particles (e.g. 20 $\mu$m) and small sized particles (e.g. 1 $\mu$m) can be used. As illustrated in FIG. 7B, use of large sized irregular particles 731–739 and small sized spherical particles 741–747 allows small sized particles 741–747 to occupy the interstitial space between large sized particles 731–739 thereby resulting in higher loading and lower initial resistance than possible by using uniform sized particles. For clarity, not all of the particles in MFV 730 are labelled.

Photoimagable dielectric layers 141, 142 (FIG. 1) can be formed of an adhesive and either PSR 4000 available from Taiyo America, Inc., Carson City, Nev., or Shipley XP-9500 available from Shipley Inc., Mariboro, Mass. For example, a photoimagable dielectric material can be formed by mixing 25% by volume of the EPOTEK material B9101-Z and 75% by volume TAIYO material PSR 4000. Material B9101-Z provides adhesion between dielectric layers 141, 142 and the copper layers (e.g. layers 251–252 in FIG. 2E).

Although a photoimagable dielectric material is used in one embodiment, other types of dielectric materials such as solder mask, epoxy, or polyimide can also be used to form the dielectric layer surrounding a MFV. Also, in one embodiment, the dielectric layer surrounding a number of MFVs is devoid of woven glass fibers and optionally includes a number of nonwoven glass pieces such as chopped glass fibers, with the fibers largest dimension being less than the smallest diameter of the holes containing the MFVs. During development of the dielectric layer, the nonwoven glass pieces (if any) are removed to form the holes.

In one embodiment, to ensure electrical contact between MFV particles and conductive layers, oxidation on the traces and on the particles is reduced or eliminated by the choice of particle materials or environment. Depending on the substrate to be formed, MFV particles can be made of materials that are less likely to be oxidized, such as (1) the noble metals including, for example, gold, silver, or palladium, or (2) alloys including, for example, Pb/Sn eutectic or (3) noble metal coated particles, including, for example, silver coated copper particles.

For MFV particles formed of materials that can be oxidized, such as copper, the oxidation rate can be reduced by providing an appropriate environment. For example, a nitrogen atmosphere can be used, especially in a high temperature process such as lamination. Oxidation can also be reduced or eliminated by vacuum lamination. Vacuum lamination reduces pressure, removes air bubbles during lamination, reduces oxidation rate and improves adhesion between particles.

In one embodiment, the MFV material is chosen to have a coefficient of thermal expansion (CTE) approximately the same as that of the surrounding dielectric layer. For example, a MFV material having a low loading (such as 15%) of conductive particles dispersed in a polymer binding material (such as PSR 4000) can be used to form a MFV (such as MFV 714) having approximately the same CTE as the surrounding dielectric layer (such as layer 717 also formed of PSR 4000). Such a MFV has lower thermal stress and better reliability than a MFV formed of materials having a different CTE than the surrounding dielectric layer.

Differences in the CTE between (1) conductive particles and the binding material of a MFV material or (2) conductive layer and the binding material can also result in thermal stress build up that eventually breaks (i.e. opens) an electrical conductor.

Such a problem can be avoided by choosing a binding material (such as polyimide, multifunctional epoxy and bismolyimide traizine) having (1) a CTE approximately equal to the CTE of the conductive particles and the conductive layers; and (2) a glass transition temperature higher than the subsequent processing temperatures and the temperatures of the environment in which the substrate is operated.

Figure 8A:
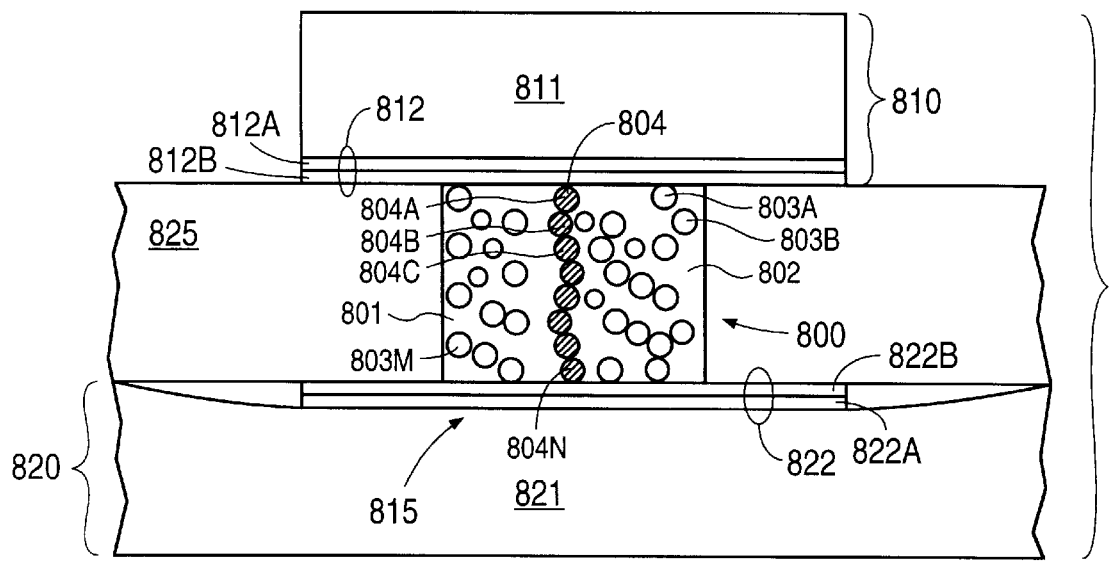
FIGS. 8A–8F illustrate formation of an electrical conductor in a micro filled via material having three different loadings of conductive particles in a dielectric material.

FIG. 8A illustrates a micro filled via (MFV) 800 formed of a MFV material 801. MFV material 801 includes a binding material 802 and a number of conductive particles 803A–803M (where M is the total number of particles within micro filled via 800). Although particles 803A–803M are illustrated in FIG. 8A as being spherical in shape and of uniform size, these particles preferably have irregular shapes and non-uniform sizes to permit the highest possible loading.

Micro filled via 800 is placed between the two conductive traces 810 and 820 that are separated by a dielectric layer 825. Conductive trace 810 is formed of a copper foil 811 having a thickness of 0.7 mil. in this embodiment, and an optional interfacial layer 812 that reduces the contact resistance between copper foil 811 and micro filled via 800.

Interfacial layer 812 is a non-oxidizing layer that can be formed of first noble metal layer 812A (e.g. formed of nickel) having a thickness between 20 to 200 micro inches and a second noble metal layer 812B (e.g. formed of gold) having a thickness between 5 to 50 micro inches. Instead of gold and nickel, other noble metals such as silver and palladium can also be used in an interfacial layer in other embodiments. In another embodiment, a nonnoble metal, such as zinc, is used to form the interfacial layer 812.

In this embodiment, trace 820 is similarly formed of a copper layer 821 and an interfacial layer 822 including a nickel layer 822A and a gold layer 822B of the same thicknesses as those of layers 812A and 812B. Noble metal layers 812 and 822 can be formed selectively, i.e. only over area 815 in which a micro filled via 800 is located. For example, if micro filled via 800 has a 5 mil. diameter, noble metal layers 812 and 822, can be between 5 to 10 mil. in diameter, and concentric with micro filled via 800. Such selective coating of noble metals reduces the cost, as compared to blanket coating the entire copper foil used to form trace 820.

In this embodiment, micro filled via material 801 has a loading greater than 30% by volume. In such a MFV 800, typically there exists at least one electrical conductor 804 originally formed as a chain of a number of conductive particles 804A–804N, without any programming.

Figure 8B:
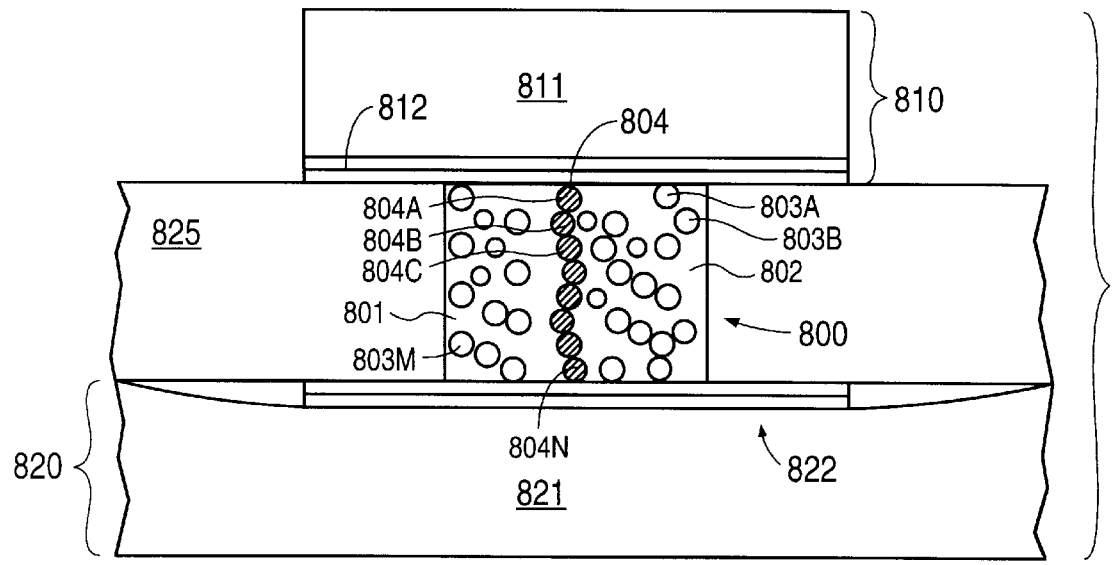

For clarity in FIGS. 8A and 8B, particles 804A–804N that form the electrical conductor 804 are shown hatched. Conductive particle 804A is in contact (1) with layer 812B and (2) with particle 804B. Similarly, particle 804B is in contact with particle 804C and so on, with particle 804N being in contact with layer 822B. Micro filled via material 801 is considered to be densely populated if at least one electrical conductor 804 connecting conductive layers 810 and 820 is formed simply by contact of the conductive particles in MFV material 801.

Even if a pair of adjacent particles among the chain of particles 804A–804N do not contact each other on placement of MFV material 801 on layer 820, such a pair of particles contact each other during lamination. Specifically, as the conductive particles 804A and 804B have a greater density and rigidity, as compared to the surrounding binding material 802, during the lamination step, particles 804A and 804B located adjacent to each other in the direction of lamination are forced into contact with each other, while binding material 802 between these adjacent particles 804A and 804B is squeezed out.

After an electrical conductor 804 is formed by contact of particles 804A–804N and traces 810 and 820, passage of a programming current through MFV 800 can lower the resistance of electrical conductor 804 as follows. In one embodiment, on passage of the programming current, particle 804A heats up and the binding material 802 surrounding particle 804A receives the heat, softens and moves out from between particle 804A and layer 812B, and also from between particle 804A and particle 804B, so that the area of contact between the respective particles increases up to the maximum possible in the absence of the binding material 802. A similar process occurs for the other particles 804B–804N.

In another embodiment, on passage of a large programming current (e.g. 4 A–10 A) through the particles of a densely populated MFV material, an electrical conductor is formed by physical breakdown of the binding material into one or more carbonized filaments of the type described below in reference to FIGS. 8C–8D.

An MFV's resistance after programming can remain unchanged (at the initial resistance) for example, (a) if the contact area between particles is already the maximum possible area prior to programming, (b) if the programming current does not cause local heating sufficient to soften and move the binding material or (c) if the programming voltage does not breakdown the binding material.

When programming of the MFV material is driven by a current requirement (of 1 A–10 A in one embodiment), the necessary programming voltage depends on the initial resistance of the MFV material. The initial resistance of the MFV material can be low (e.g. 1 mΩ–100 mΩ, for example, if the MFV material is a conductive paste (described above) or can be quite high (e.g. 1 GΩ–100 GΩ) if the MFV material is a non-conductive material (without conductive particles or with a low loading of conductive particles).

If the initial resistance is low (e.g. 0.001 Ω–10 Ω) then the programming voltage is small, e.g. 0.5 V to 10 V, with a programming current of e.g. 1–10 amp. If the initial resistance is high (e.g. 1 MΩ–10 GΩ) then a programming voltage is large, e.g. 50 V to 200 V, with a programming current of e.g. 0.01 amp.–0.5 amp.

Figure 9A:
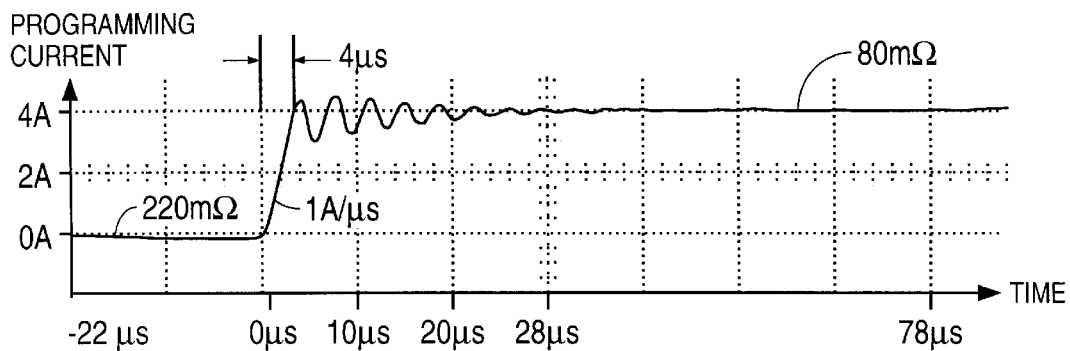
FIGS. 9A–9D illustrate the resistances of micro filled vias of a substrate before and after programming.
Figure 9B:
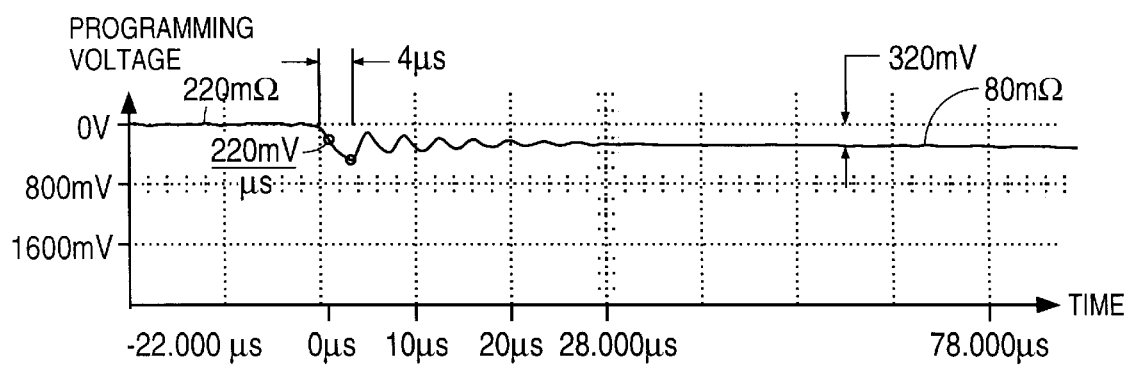
Figure 9C:
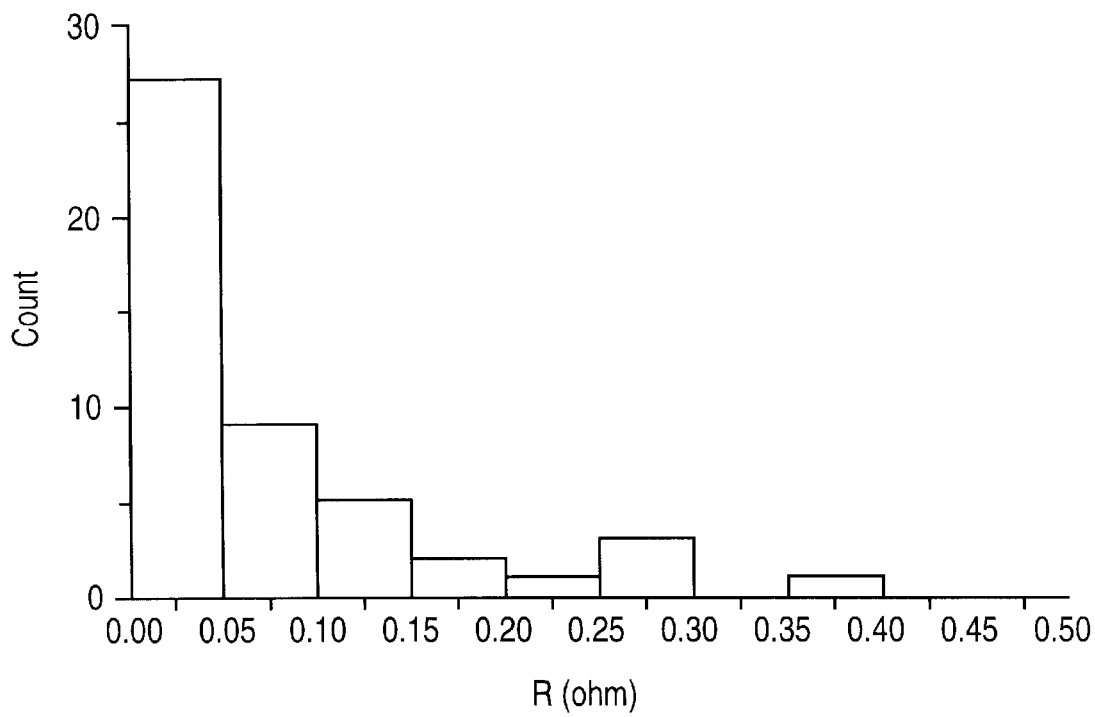
Figure 9D:
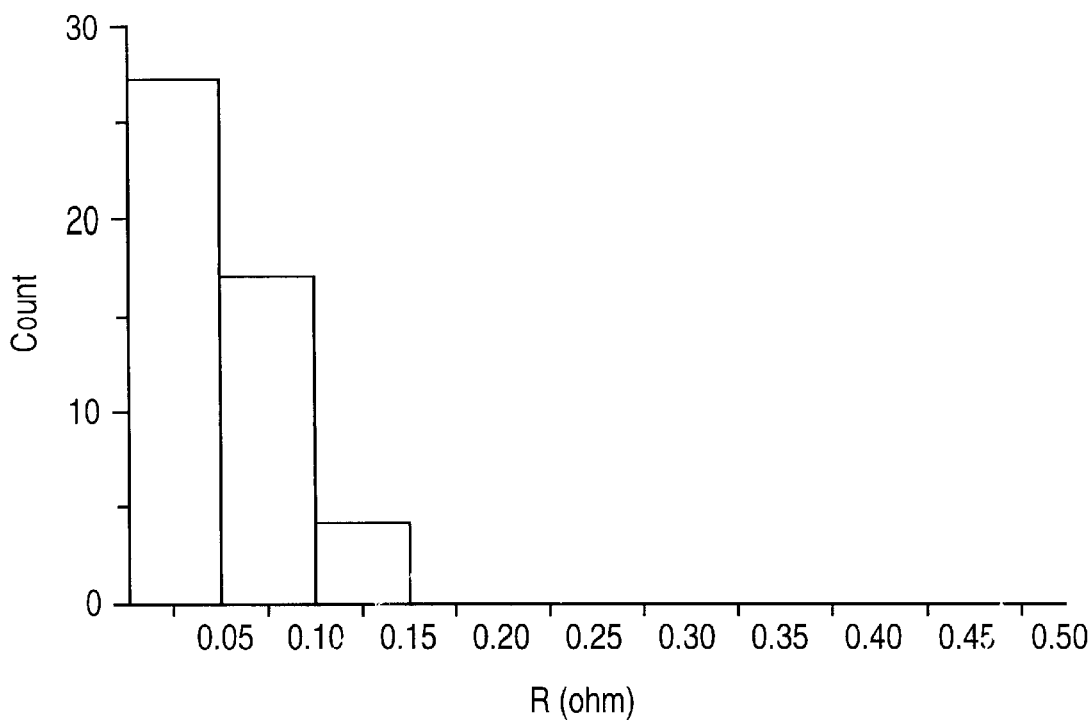

Applying a programming voltage and current to an originally conductive MFV (such as a MFV formed of conductive paste) as described below in reference to FIGS. 9A–9B ensures a uniform low resistance distribution of the MFVs (FIGS. 9C–9D). Specifically, MFVs with initial resistances higher than a predetermined value have resistances closer to the predetermined value after programming. For example, to ensure a resistance of less than 0.1 Ω, currents of 1–8 amperes can be applied to MFVs 111–114 and 281–284 during programming. Programming as described above could eliminate the need for noble metals, such as gold, for example to promote contact between traces 131, 221A (FIG. 2G) and MFV 241A located between these traces. Programming can also improve the contact reliability.

Programming a large number of MFVs can take a long time as compared to the time needed to program a single MFV. Lowering the programming voltage reduces the time need to charge/discharge a programming circuit and so makes programming faster, allowing a larger number of MFVs to be programmed together.

When compared to using a pure dielectric material as the MFV material, a high loading of conductive particles e.g. 60% by volume lowers the programming voltage required to produce a higher programming current, for a smaller programming time.

In one embodiment, a MFV with a low initial resistance has a relatively small voltage drop, 10 allowing a larger number of MFVs to be programmed in a single path. With appropriate loading (e.g. 40%–50% by volume) and particle shape (e.g. flake or irregular shape), a MFV having an initial resistance of about 10 ohms (or less) can be formed and up to 10 MFVs can be is programmed in a single path. When all the MFVs to be programmed are in series, the same programming current passes through each MFV.

In one embodiment, a MFV having an initial resistance less than 1 ohm can be formed by using a conductive paste with a wide distribution in particle size, from less than 1 micron to 20 microns, so that the resistance of the programmed MFV is less than 0.1 ohm. In another embodiment, the MFV's initial resistance is designed to be approximately 0.1 Ω by using a MFV material formed of irregular shaped silver particles with sizes uniformly distributed between 1 to 15 micron at a 45%. loading by volume in a binder (e.g. EPOTEK B9101-2), so that after programming the MFV's resistance falls to approximately 0.01 Ω.

In a densely populated MFV material 801 (FIG. 8A), if a layer of oxide separates two adjacent particles (e.g. particles 804A–804B), or a conductive layer (e.g. layer 811) and a particle (e.g. particle 804A) adjacent to the conductive layer, passage of a programming current heats up and melts the oxide layer locally. As an oxide's melting temperature (e.g. >1000° C.) is typically higher than that of a material used to form the conductive particle (e.g. silver) and a conductive layer (e.g. copper), these materials melt and fuse with each other to form links between the particles, and between the particles and the conductive layer. Therefore, an electric current path in a densely populated MFV material is formed only of the materials of one or more particles and materials of the conductive layers.

Figure 8C:
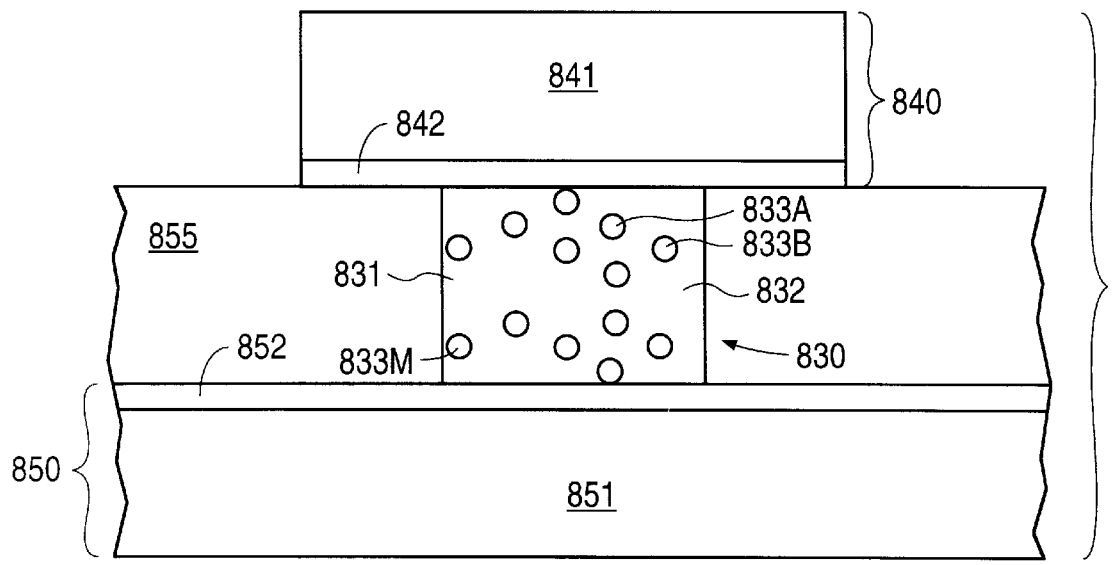
Figure 8D:
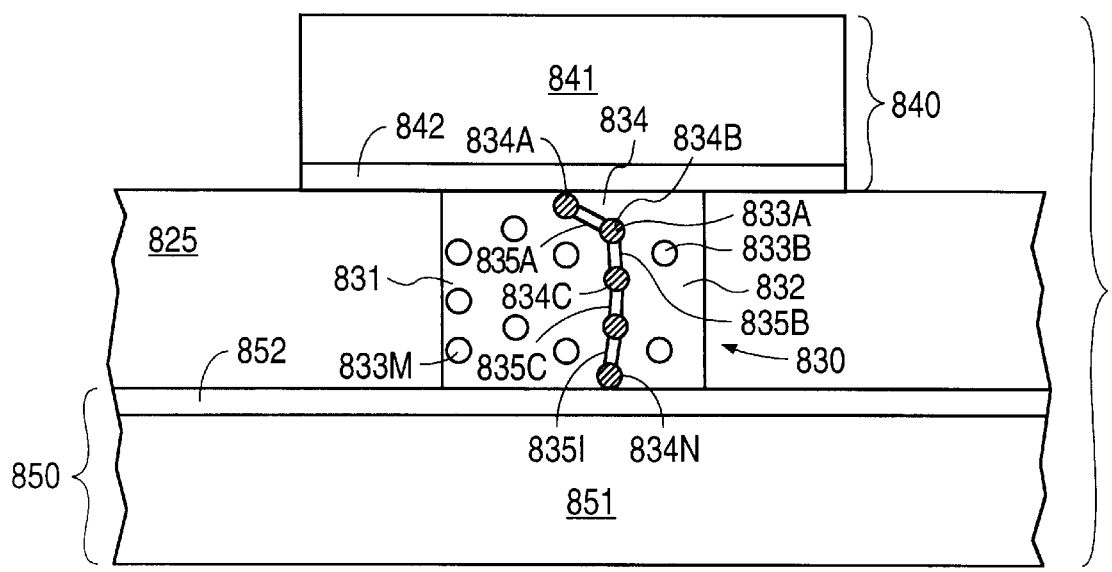

FIGS. 8C and 8D illustrate another micro filled via 830 located between traces 840 and 850. The reference numerals in FIGS. 8C and 8D are derived by adding 30 to reference numerals in FIGS. 8A and 8B that illustrate similar features. Micro filled via material 831 is sparsely populated with conductive particles 833A–833M (where M is the total number of conductive particles) that occupy only 10% of the volume of micro filled via 830 in this embodiment. Dielectric material 832 insulates each of the conductive particles 833A–833M from another of the conductive particles 833A–833M. Therefore conductive particles 833A–833M do not initially form a conductive path between traces 840 and 850.

On application of a programming voltage between traces 840 and 850, an electric current path 834 is formed as a chain of conductive particles 834A–834N (where N is the total number of conductive particles within electrical conductor 834), and a number of conductive links 835A–835N–1 formed by the breakdown of dielectric material 832 between particles 834A–834N into carbonized filaments. The breakdown of a dielectric material into carbonized filaments is described in, for example, "Electrical Properties of Polymers" edited by Donald A. Seanor, Academic Press, 1982, that is incorporated by reference herein in its entirety.

As the size of conductive particles 834A–834M becomes larger, links 835A–835N–1 become shorter and so electric current path 834 becomes more substantial, thereby providing a more reliable electrical connection between traces 840 and 850.

Figure 8E:
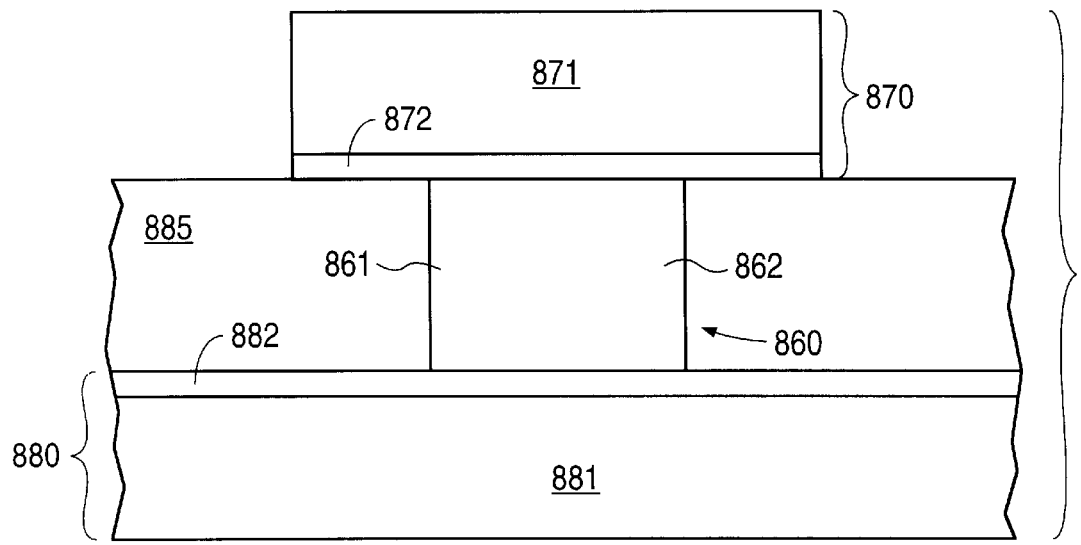
Figure 8F:
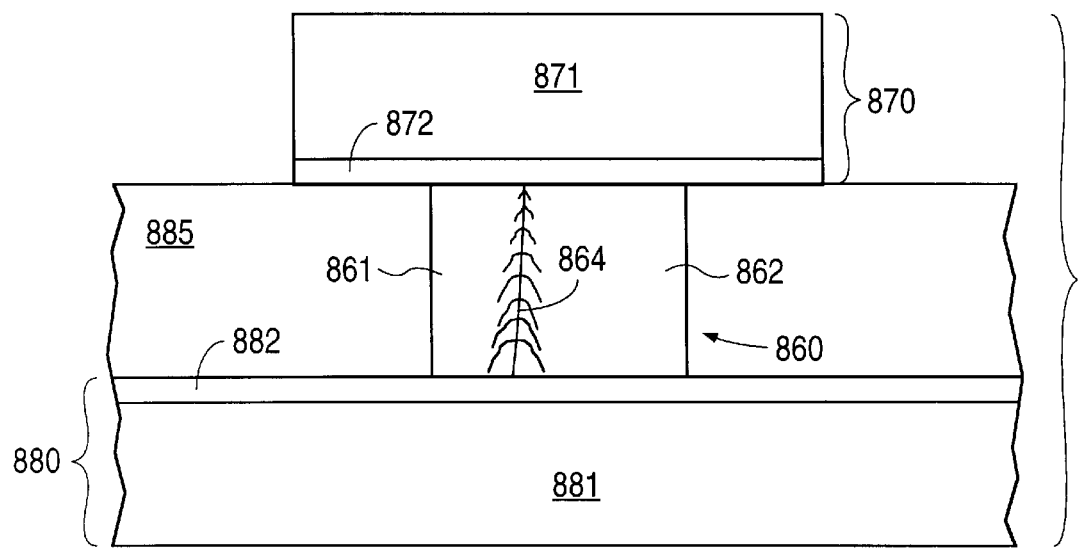

FIGS. 8E and 8F illustrate the formation of an electric current path in micro filled via 860 formed between traces 870 and 880. The reference numerals in FIGS. 8E and 8F are derived by adding 30 to the reference numerals that illustrate similar features in FIGS. 8C and 8D. Micro filled via material 861 in one embodiment is formed of a single dielectric material 862. On application of a programming voltage between traces 870 and 880, an electric current path 864 is formed as a carbonized filament connecting the two traces 870 and 880. Electric current path 864 includes a single central filament surrounded by a number of branch filaments in a tree-shaped structure. The branch filaments generally do not connect the traces 870, 880.

Programming as described above in reference to FIGS. 8A–8F, can be performed, after a substrate's manufacturing is completed, immediately after a substrate's final testing to check whether a MFV is open or short, thereby eliminating a separate step of programming. Alternatively, MFV testing can be performed immediately after the traces are formed over the MFV material. Having early MFV test results eliminates further processing (and costs) of substrates having defective electrical conductors.

FIGS. 9A and 9B illustrate the variation of current and voltage during programming of a micro filled via. In FIGS. 9A and 9B, the illustrated MFV has a diameter of 6 mils, height of 2 mils, and contains an electrical conductor with initial resistance of 220 mΩ formed of a conductive paste of silver particles in a hole of a dielectric layer in a printed circuit board substrate.

During programming the MFV by applying a programming current pulse of 4 A for 5 millisecond, the drop in the MFV's resistance occurs very quickly: the voltage drop across the MFV changes at the rate of 220 mV/μs in the first 2 microseconds (FIG. 9B). Also, the current rises from 0 A to 4 A (at the fast rate of 1 A/μs) up to 4 microseconds, and saturates at 10 microseconds (FIG. 9A). By 28 microseconds, the voltage stabilizes at about 320 mV and the current at 4 A, so that the resistance after programming is about 80 mΩ.

In another embodiment, programming a MFV having an electrical conductor with initial resistance of 336 mΩ with a current pulse of 4 A for 5 milliseconds lowers the MFV's resistance to 114 mΩ in 10 microseconds.

FIG. 9C illustrates a distribution of the initial resistances (i.e. before programming) of a number of micro filled vias formed of a densely populated MFV material. The resistances illustrated in FIG. 9C include the resistances of traces directly connected to the MFVs. Also, in the embodiment illustrated in FIG. 9C, the MFVs have a thickness of 2 mils, a diameter of 10 mils, are formed of paste PC 5328 (referenced above), and the conductive layers are formed of ½ ounce copper foil (0.7 mil. thickness) available from Mitsui (referenced above). In this embodiment, the MFVs were designed to have a resistance less than the predetermined value of 0.20 Ω, although as shown in FIG. 9C, some of the MFVs have a resistance higher than this predetermined value of 0.20 Ω.

FIG. 9D illustrates the resistance of the MFVs of FIG. 9C after programming each MFV, by passage of a programming current of four amps, at 1 to 10 volts for 5 milliseconds. As seen from FIG. 9D, none of the MFVs has a resistance higher than the predetermined value.

Therefore, programming of MFVs as described herein improves the conductivity of the MFVs. Programming of all MFVs could eliminate the need for measuring the resistance of each MFV (as described below). Moreover, programming of all MFVs could be faster than selective programming when a large number (e.g. a majority) of the MFVs have an initial resistance greater than the predetermined value.

In one embodiment, only certain MFVs having a resistance greater than the predetermined value are programmed. In this embodiment, an intermediate step of measuring each MFV's resistance is required prior to the programming step. In such an embodiment, unprogrammed MFVs are used, in addition to programmed MFVs, to implement the predetermined circuit.

Programming as described herein can also be applied to a conventionally formed electrical conductor (i.e. an electrical conductor formed by conventional methods and without programming) to reduce the conventional conductor's resistance to a value below a predetermined value needed to implement a predetermined circuit.

Programming to permanently change the physical structure of a MFV material (e.g. breakdown the binding material) as described herein can improve the current carrying capacity and reduce the resistance of prior art electrical conductors of the type described in, for example, U.S. Pat. Nos. 5,282,312, 5,250,228, 5,428,190, 5,300,208, by Wada et al. (above) all of which are incorporated by reference herein in their entirety. Specifically, an electrical conductor, conventionally formed by using conductive paste in the shape of one or more cones (each cone having a tip and a circular base broader than the tip) to pierce through a core layer, is enhanced by passage of a programming current as described herein. After such programming, the electrical conductor has improved current carrying capacity and lower resistance than a conductor formed by simply using the conventional piercing process alone.

Programming to reduce the resistance of an electrical conductor eliminates the need to use the prior art's blind vias, drill bits and gold plating, all of which are very expensive as compared to MFVs.

Also, use of dams as described herein to provide structural strength to a substrate eliminates the need for a substrate to have a prior art core containing woven glass fibers, again reducing costs.

Although certain structures and methods are described herein, MFVs can be formed in any structure at any location requiring an electrical conductor passing through one or more dielectric layers. Therefore the MFVs described herein can improve the density of circuitry implemented in substrates of printed circuit boards, printed wiring boards, multichip modules and IC packages thereby allowing scaling of products for use in, for example, notebook personal computers and portable cellular phones.

Although certain printed circuit boards have been illustrated in FIGS. 1–9, other types of printed circuit boards, such as a three layer board, can also be formed using one or more of the steps described herein. Also, a PCB with traces on only a single side can be formed using one or more steps described herein. Moreover, the MFV formation methods discussed above can also use a solid metal sheet (for connection to a power source or ground) as a central supporting portion of a substrate, instead of using a dielectric core layer as described above.

Figure 4K:
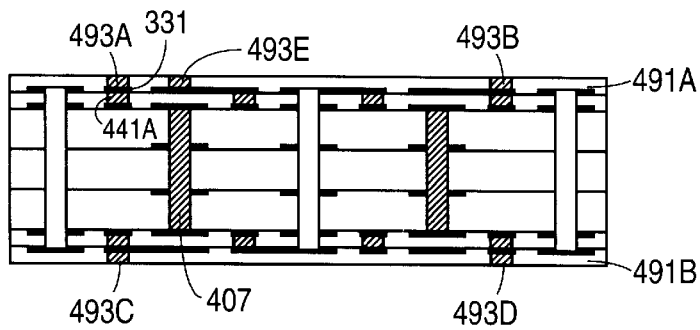
Figure 4L:
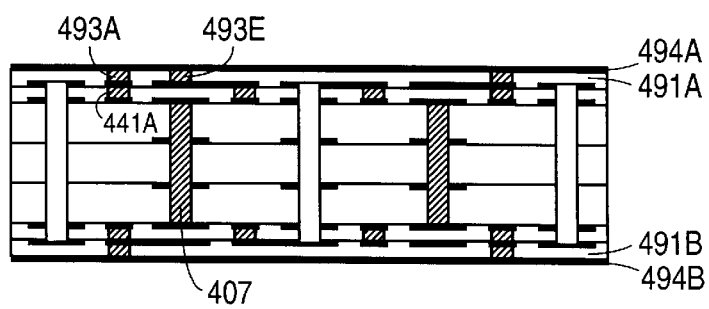
Figure 4M:
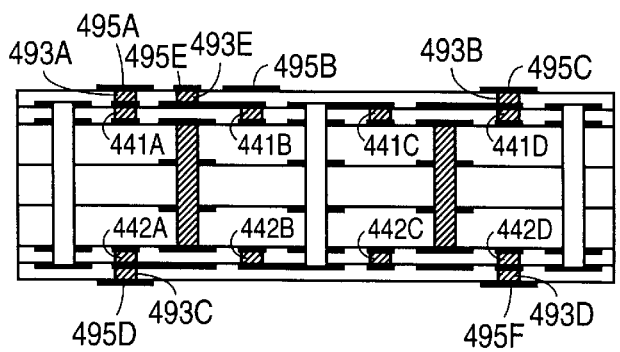
Figure 4N:
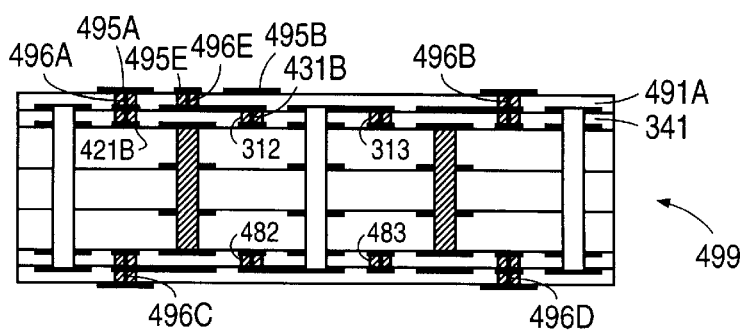

Although MFVs 493A and 441A illustrated in FIG. 4K are stacked over each other and connected to each other through a trace 331, in other embodiments such MFVs can be placed directly in contact with each other without an intervening trace. Moreover, although only two MFVs are illustrated as being stacked to connect traces separated from each other by two dielectric layers, any number of MFVs can be stacked in other embodiments.

Figure 2E:
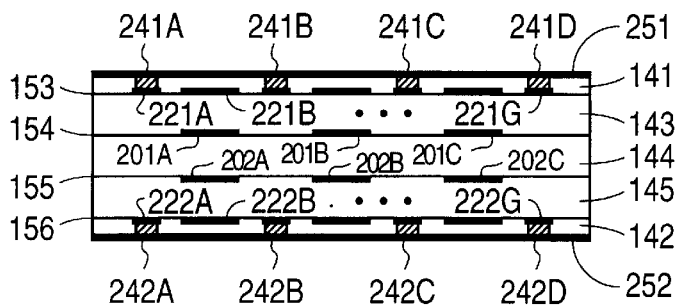
Figure 2F:
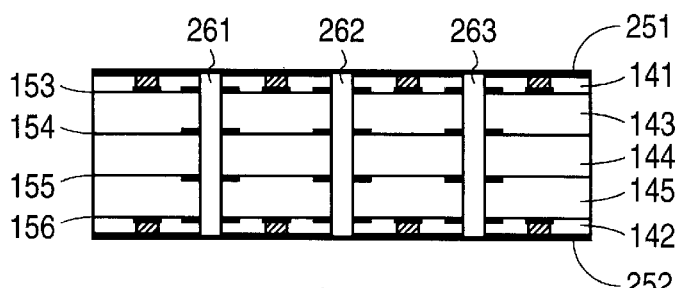
Figure 2G:
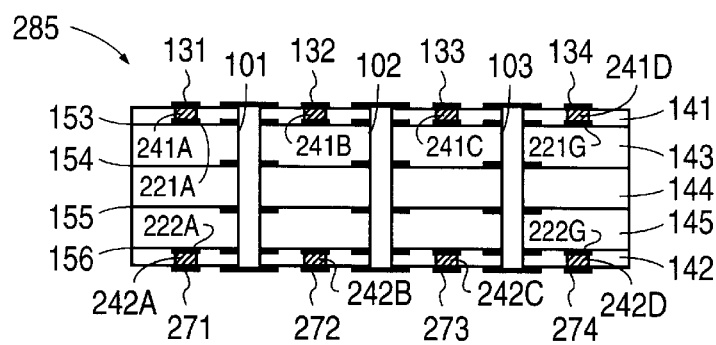
Figure 2H:
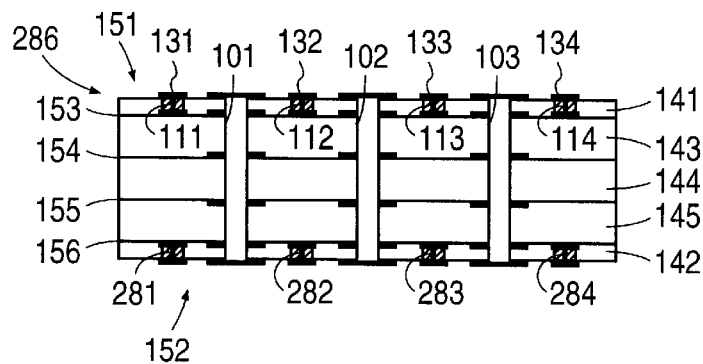

Although in one embodiment copper foils are formed by lamination to a dielectric layer, copper layers can also be formed by electroless plating on the structure illustrated in FIG. 2D to form the structure illustrated in FIG. 2E.

Although the MFV material is placed at certain locations predetermined to require an electrical conductor, a MFV material formed of a nonconductive material can be blanket deposited, as described in U.S. patent application Ser. No. 08/374,941 referenced above. In such an embodiment, after a conductive layer is formed over the blanket deposited nonconductive layer, and after the conductive layer is printed and etched, a programming voltage must be applied across any two traces separated by the nonconductive material at each predetermined location to form an electrical conductor through the nonconductive material.

Although in some embodiments the MFVs are formed only at predetermined locations (determined by the predetermined circuit to be implemented), the MFVs can be formed at a number of locations arranged in the form of a matrix, to implement a programmable structure. In one embodiment, such a programmable structure does not implement a circuit until a user's programming. Specifically, one or more electrical conductors are selectively formed through the MFVs in such a structure only by a user's programming of selected MFVs to implement a circuit selected by the user, after fabrication of the programmable structure, for example in a manner described in U.S. patent application Ser. No. 08/320,145 referenced above. In such an embodiment, both conductive as well as non-conductive MFVs form essential and normal parts of the circuit implemented by the user.

Various modifications and adaptations of this invention are encompassed by the accompanying claims.

We claim:

1. A method of forming a structure for supporting a plurality of electronic components, said method comprising:
    forming a compound layer comprising a first material and a dielectric layer, said first material being located in at least a first hole in said dielectric layer; and
    programming the first material located in said first hole; wherein:
        said compound layer separates a first conductive layer from a second conductive layer;
        said dielectric layer is photoimagible; and
        said step of forming comprises:
            imaging and developing said dielectric layer to form at least said first hole; and
            placing said first material in said first hole.

2. The method of claim 1 further comprising partially curing said dielectric layer to a nontacky condition prior to said step of placing said first material.

3. The method of claim 1 further comprising
    applying a nontacky layer over said dielectric layer before said imaging; and
    dissolving said nontacky layer during said developing.

4. A method of forming a structure for supporting a plurality of electronic components, said method comprising:
    forming a compound layer comprising a first material and a dielectric layer, said first material being located in at least a first hole in said dielectric layer; and
    programming the first material located in said first hole; wherein:
        said compound layer separates a first conductive layer from a second conductive layer; and
        said step of forming comprises:
            stencil printing said first material; and
            screen printing said dielectric layer.

5. The method of claim 4 wherein said stencil printing step is done after said screen printing step.

6. The method of claim 4 further comprising a step of partially curing a dielectric layer using heat.

7. The method of claim 4 further comprising a step of partially curing a dielectric layer using ultraviolet light.

8. A method of forming a structure for supporting a plurality of electronic components, said method comprising:
    forming a compound layer comprising a first material and a dielectric layer, said first material being located in at least a first hole in said dielectric layer;
    applying an adhesive layer over said compound layer prior to formation of said second conductive layer, said adhesive layer having a thickness less than a thickness of said compound layer; and
    programming the first material located in said first hole; wherein:
        said compound layer separates a first conductive layer from a second conductive layer.

9. A method of forming a structure for supporting a plurality of electronic components, said method comprising:
    forming a compound layer comprising a first material and a dielectric layer, said first material being located in at least a first hole in said dielectric layer; and
    programming the first material located in said first hole; wherein:
        said compound layer separates a first conductive layer from a second conductive layer;
        said first material has a second breakdown voltage lower than a first breakdown voltage of said dielectric layer;

said programming voltage is greater than or equal to said second breakdown voltage; and said programming step forms an electrical conductor connecting said conductive layers.

10. A method of forming a structure for supporting a plurality of electronic components, said method comprising:

forming a compound layer comprising a first material and a dielectric layer, said first material being located in at least a first hole in said dielectric layer; and programming the first material located in said first hole; wherein:

said compound layer separates a first conductive layer from a second conductive layer; and said forming step further comprises providing a plurality of dams.

11. The method of claim 10 wherein each of said dams is formed at a location free of said first conductive layer and said second conductive layer.

12. A method of forming a structure for supporting a plurality of electronic components, said method comprising:

forming a compound layer comprising a first material and a dielectric layer, said first material being located in at least a first hole in said dielectric layer; and programming the first material located in said first hole; wherein:

said compound layer separates a first conductive layer from a second conductive layer;

said first material is densely populated with conductive particles; and a programming current is passed through said micro filled via material to reduce the resistance of an electrical conductor originally formed in said first material.

13. The method of claim 12 wherein said step of programming comprises enhancing said electrical conductor by softening and moving the binding material from between said conductive particles to increase the contact area and reduce the contact resistance between adjacent particles.

14. The method of claim 12 wherein said step of programming comprises enhancing said electrical conductor by softening and moving the binding material from between a conductive particle and a conductive layer.

15. A method of forming a structure for supporting a plurality of electronic components, said method comprising:

forming a compound layer comprising a first material and a dielectric layer, said first material being located in at least a first hole in said dielectric layer; and programming the first material located in said first hole; wherein:

said compound layer separates a first conductive layer from a second conductive layer;

said first material comprises a dielectric material; and said step of programming comprises breaking down said dielectric material to form at least one carbonized filament.

16. The method of claim 15 wherein said first material further comprises at least one conductive particle and said step of programming forms at least two carbonized filaments coupled to said conductive particle.

17. A method of forming a structure for supporting a plurality of electronic components, said method comprising:

forming a compound layer comprising a first material and a dielectric layer, said first material being located in at least a first hole in said dielectric layer, wherein said compound layer separates a first conductive layer from a second conductive layer;

forming said first conductive layer on an insulating core layer having embedded glass fibers; and programming the first material located in said first hole.

18. A method comprising:

forming a dielectric layer devoid of woven glass fibers on at least a first trace of a first conductive layer;

forming a plurality of holes at a plurality of predetermined locations in said dielectric layer, each of said predetermined locations being a location for formation of an electrical conductor;

placing a micro filled via material in at least each of said plurality of holes, to form a compound layer;

laminating a second conductive layer on said compound layer;

etching said second conductive layer to form at least a second trace;

wherein said dielectric layer is a photoimagable layer, and wherein said step of forming a plurality of holes comprises imaging and developing said photoimagable layer.

19. The method of claim 18 wherein said step of placing comprises applying said micro filled via material to cover all of said first dielectric material.

20. The method of claim 18 wherein said micro filled via material comprises a binding material densely populated with conductive particles and wherein said step of forming comprises creating an electrical conductor in said micro filled via material by contact of at least a group of said conductive particles.

21. The method of claim 18 wherein said dielectric layer comprises a plurality of chopped glass fibers with the largest dimension of any one of said fibers being less than the smallest diameter of said holes and said step of developing comprises removing a group of said fibers during formation of said holes.

22. The method of claim 18 wherein said step of placing comprises stencil printing said micro filled via material.

23. The method of claim 18 wherein said micro filled via material comprises a binding material and a plurality of conductive particles dispersed in said binding material, said conductive particles occupying greater than 30% of the total volume of said micro filled via material.

24. The method of claim 23 wherein said micro filled via material comprises a plurality of particles formed of a conductive material that includes copper.

25. The method of claim 23 wherein said micro filled via material comprises a plurality of particles formed of a conductive material that includes gold.

26. The method of claim 23 wherein said micro filled via material comprises a plurality of particles formed of a conductive material that includes silver.

27. The method of claim 18 wherein said micro filled via material is devoid of particles.

28. The method of claim 27 wherein said micro filled via material includes a conductive polymer.

29. The method of claim 18 further comprising drilling additional holes and plating said additional holes subsequent to said step of laminating a second conductive layer on said compound layer.

30. The method of claim 18 further comprising drilling additional holes and plating said additional holes prior to said step of forming a plurality of holes.

* * * * *